United States Patent
Lee et al.

(10) Patent No.: US 9,348,356 B2
(45) Date of Patent: *May 24, 2016

(54) EMBEDDED MULTIMEDIA CARD (EMMC), HOST CONTROLLING EMMC, AND METHOD OPERATING EMMC SYSTEM

(71) Applicant: SAMSUNG ELECTRONICS CO., LTD., Suwon-Si, Gyeonggi-Do (KR)

(72) Inventors: Jung Pil Lee, Hwaseong-Si (KR); Jin Hyeok Choi, Yongin-Si (KR); Hwa Seok Oh, Yongin-Si (KR); Young-Gyu Kang, Yongin-Si (KR); Sung Ho Seo, Seoul (KR); Myung Sub Shin, Suwon-Si (KR); Kyung Phil Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 182 days.

This patent is subject to a terminal disclaimer.

(21) Appl. No.: 14/025,879

(22) Filed: Sep. 13, 2013

(65) Prior Publication Data

US 2014/0082405 A1    Mar. 20, 2014

(30) Foreign Application Priority Data

Sep. 14, 2012   (KR) .................. 10-2012-0102468

(51) Int. Cl.
G11C 8/00      (2006.01)
G06F 1/08      (2006.01)
G11C 7/22      (2006.01)
G06F 1/04      (2006.01)
G06F 1/06      (2006.01)

(52) U.S. Cl.
CPC .. *G06F 1/08* (2013.01); *G06F 1/04* (2013.01); *G11C 7/222* (2013.01); *G06F 1/06* (2013.01)

(58) Field of Classification Search
CPC .............. G06F 1/08; G06F 1/06; G11C 7/222
USPC .................... 365/233.1, 189.011, 233.11
See application file for complete search history.

(56) References Cited

U.S. PATENT DOCUMENTS

| | | | |
|---|---|---|---|
| 7,065,591 B2 | 6/2006 | Han et al. | |
| 7,159,064 B2 | 1/2007 | Gillet | |
| 7,370,168 B2 | 5/2008 | Kanamori et al. | |
| 7,738,307 B2 | 6/2010 | Song | |
| 7,886,085 B2 | 2/2011 | Suenaga et al. | |
| 8,103,917 B2 | 1/2012 | Jang | |
| 8,307,151 B1 * | 11/2012 | Caraccio et al. | 711/103 |
| 2008/0132091 A1 | 6/2008 | Choi | |
| 2008/0245878 A1 | 10/2008 | Shiota et al. | |
| 2011/0110165 A1 * | 5/2011 | Gillingham et al. | 365/189.05 |
| 2012/0120741 A1 | 5/2012 | Kim et al. | |
| 2014/0029336 A1 * | 1/2014 | Venkitachalam et al. | 365/185.03 |

FOREIGN PATENT DOCUMENTS

JP   2007072922   3/2007

* cited by examiner

*Primary Examiner* — Fernando Hidalgo
(74) *Attorney, Agent, or Firm* — Volentine & Whitt, PLLC

(57) ABSTRACT

An embedded multimedia card (eMMC) includes a clock channel that receives a clock signal from a host, a command channel that receives a command from the host, a plurality of data channels that transmit data to the host, and a return clock channel that transmits a return clock synchronized with the data to the host.

15 Claims, 31 Drawing Sheets

FIG. 23

| Name | Type1 | Description |
|---|---|---|
| CLK | I | Clock |
| CLKn | I | CLK Complement (Host Connection Optional)<br>CLK_n is paired with CLK to provide differential signaling |
| RCLK | O | Data Strobe Clock<br>Output with data read (edge aligned) |
| RCLK_n* | O | RCLK Complement (Host Connection Optional)<br>RCLK_n is paired with RCLK to provide differential signaling |
| DAT0 | I/O/PP | Data |
| DAT1 | I/O/PP | Data |
| DAT2 | I/O/PP | Data |
| DAT3 | I/O/PP | Data |
| DAT4 | I/O/PP | Data |
| DAT5 | I/O/PP | Data |
| DAT6 | I/O/PP | Data |
| DAT7 | I/O/PP | Data |
| CMD | I/O/PP/OD | Command/Response |
| RST_n | I | Hardware reset |
| VCC | S | Supply voltage for Core |
| VCCQ | S | Supply voltage for I/O |
| VSS | S | Supply voltage ground for Core |
| VSSQ | S | Supply voltage ground for I/O |
| VREF* | S | Voltage Refense (Host Connection Optional)<br>The Voltage Reference is optional for the host to provide |

NOTE :
I : input; O: output; PP: push-pull; OD: open-drain; NC: Not connected (or logical high); S: power supply
*: If not used, the host shall not connect optional pin

FIG. 24

| Bit | Device Type |
|---|---|
| 7 | DDR400 Dual Data Rate e·MMC @ 200 MHz – 1.2V I/O |
| 6 | DDR400 Dual Data Rate e·MMC @ 200 MHz – 1.8V I/O |
| 5 | HS200 Single Data Rate e·MMC @ 200 MHz – 1.2V I/O |
| 4 | HS200 Single Data Rate e·MMC @ 200 MHz – 1.8V I/O |
| 3 | High-Speed Dual Data Rate e·MMC @ 52 MHz – 1.2V I/O |
| 2 | High-Speed Dual Data Rate e·MMC @ 52 MHz – 1.8V or 3V I/O |
| 1 | High-Speed e·MMC @ 52 MHz – at rated device voltage(s) |
| 0 | High-Speed e·MMC @ 26 MHz – at rated device voltage(s) |

FIG. 25A

HS_TIMING(timing and driver strength)

| Bit 7 | Bit 6 | Bit 5 | Bit 4 | Bit 3 | Bit 2 | Bit 1 | Bit 0 |
|---|---|---|---|---|---|---|---|
| Selected Driver Strength | | | | Timing Interface | | | |

FIG. 25B

HS_TIMING values

| Value | Timing Interface | Remarks |
|---|---|---|
| 0x0 | Selecting backwards compatibility interface timing | |
| 0x1 | High Speed | |
| 0x2 | HS200 | |
| 0x3 | DDR400 | |

FIG. 27

| Parameter | | Symbol | Min | Max. | Unit | Remark |
|---|---|---|---|---|---|---|
| Input CLK | | | | | | |
| Cycle time data transfer mode | | $t_{PERIOD}$ | 5 | — | ns | 200MHz(Max.), between rising edges |
| Clock high time | | $t_{WH}$ | 1.5 | | ns | $C_{BGA} \leq 6pF$ |
| Clock low time | | $t_{WL}$ | 1.5 | | ns | $C_{BGA} \leq 6pF$ |
| Clock rising/falling time | | $t_{TLH}, t_{THL}$ | — | $0.2 \cdot t_{PERIOD}$ | ns | tTLH, tTHL<1ns(max.)at 200MHz, $C_{BGA}$=6pF, The absolute maximum value of tTLH, tTHL is 10ns regardless of clock frequency. |
| Clock duty cycle | | | 47.5 | 52.5 | % | Includes jitter, phase noise |
| Input DAT (referenced to CLK) | | | | | | |
| 333MHz | Input set-up time | tISUddr | 0.5 | | ns | $4pF \leq C_{BGA} \leq 6pF$ |
| | Input hold time | tIHddr | 0.5 | | ns | $4pF \leq C_{BGA} \leq 6pF$ |
| 400MHz | Input set-up time | tISUddr | 0.4 | | ns | $4pF \leq C_{BGA} \leq 6pF$ |
| | Input hold time | tIHddr | 0.4 | | ns | $4pF \leq C_{BGA} \leq 6pF$ |

FIG. 29

| Parameter | | Symbol | Min | Max. | Unit | Remark |
|---|---|---|---|---|---|---|
| Output CLK | | | | | | |
| Cycle time data transfer mode | | $t_{PERIOD}$ | 5 | – | ns | 200MHz(Max.), between rising edges |
| RCLK high time | | $t_{RWH}$ | 1.5 | | ns | $C_{BGA} \leq 6pF$ |
| RCLK low time | | $t_{RWL}$ | 1.5 | | ns | $C_{BGA} \leq 6pF$ |
| Clock rising/falling time | | $t_{TLH}, t_{THL}$ | – | $0.2 \cdot t_{PERIOD}$ | ns | tTLH, tTHL<1ns(max.)at 200MHz, $C_{BGA}$=6pF, The absolute maximum value of tTLH, tTHL is 10ns regardless of clock frequency. |
| Clock duty cycle | | | 45 | 55 | % | Includes jitter, phase noise |
| Output DAT (referenced to RCLK) | | | | | | |
| 333MHz | Output hold skew | tRQ | 0.5 | | ns | $4pF \leq C_{BGA} \leq 6pF$ |
| | Output hold time | tRQH | 0.5 | | ns | $4pF \leq C_{BGA} \leq 6pF$ |
| 400MHz | Output hold skew | tRQ | 0.4 | | ns | $4pF \leq C_{BGA} \leq 6pF$ |
| | Output hold time | tRQH | 0.4 | | ns | $4pF \leq C_{BGA} \leq 6pF$ |

EMBEDDED MULTIMEDIA CARD (EMMC), HOST CONTROLLING EMMC, AND METHOD OPERATING EMMC SYSTEM

CROSS-REFERENCE TO RELATED APPLICATIONS

This application claims priority under 35 U.S.C. §119(a) from Korean Patent Application No. 10-2012-0102467 filed on Sep. 14, 2012, the subject matter of which is hereby incorporated by reference.

BACKGROUND

The inventive concept relates to the so-called "embedded multimedia card" or "eMMC". More particularly, the inventive concept relates to eMMCs that are capable of increasing data transmission speed and securing a data valid window. Embodiments of the inventive concept variously include eMMCs, hosts controlling eMMCs, and methods of operating eMMC systems.

The so-called multimedia card (MMC) is a flash memory card standard. The eMMC is an embedded MMC standard defined by the Joint Electron Devices Engineering Council (JEDEC). In general configuration and application eMMCs are designed to be inserted (or "embedded") in conjunction with a host within mobile communication devices such as smart phones. Conventionally, the eMMC communicates data signals, control signals, commands, clock(s) and/or power signals with the connected host in accordance with a standardize 10-signal bus.

SUMMARY

According to certain embodiments of the inventive concept, there is provided an embedded multimedia card (eMMC) including; a clock channel that receives a clock from a host via a clock line, a command channel that receives a command from the host via a command line, a plurality of data channels that transmit data to the host via data lines, and a return clock channel that transmits a return clock to the host synchronously with the data via a return clock line separate from the clock line, the command line, and the data lines.

According to certain embodiments of the inventive concept, there is provided a host controlling an embedded multimedia card (eMMC), the host includes; a clock channel that transmits a clock to the eMMC via a clock line, a command channel that transmits a command to the eMMC via a command line, a plurality of data channels that receive data from the eMMC via data lines, and a return clock channel that receives a return clock synchronously with the data from the eMMC via a return clock line separate from the clock line, the command line, and the data lines.

According to certain embodiments of the inventive concept, there is provided a method of operating an embedded multimedia card (eMMC) system including a host and an eMMC including a flash memory. The method includes; transmitting a clock from the host to the eMMC via a clock line, transmitting a read command from the host to the eMMC via a command line, generating a return clock in the eMMC in response to the clock, transmitting data from the flash memory to the host via data lines in response to the read command, and synchronously transmitting the return clock with the data from the eMMC to the host via a return clock line separate from the clock line, command line, and data lines.

BRIEF DESCRIPTION OF THE DRAWINGS

FIG. 23 is a table listing signals of an eMMC interface according to certain embodiments of the inventive concept;

FIG. 24 is a table listing possible definitions for a device type field according to certain embodiments of the inventive concept;

FIG. 25, inclusive of FIGS. 25A and 25B, illustrates certain timing values that may be used in certain embodiments of the inventive concept;

FIG. 27 is a table listing certain parameters associated with the timing chart of FIG. 26;

FIG. 29 is a table listing certain parameters associated with the timing chart of FIG. 28;

DETAILED DESCRIPTION

Figure 1:
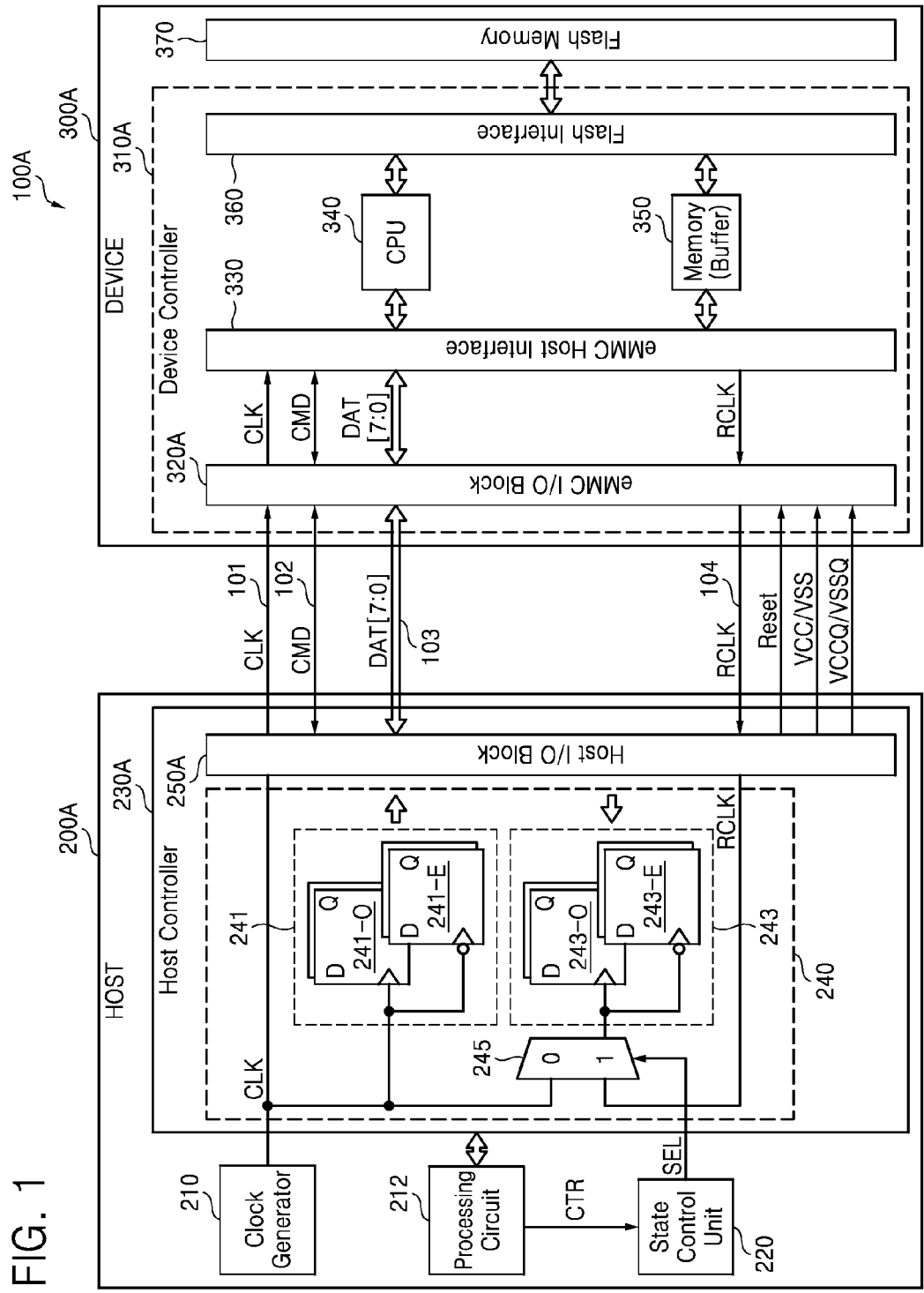
FIGS. 1, 5, 7, 9, 11, 13, 15, 17, 19 and 21 are respective block diagrams of an embedded multimedia card (eMMC) system according to various embodiments of the inventive concept.

Embodiments of the inventive concept will now be described in some additional detail with reference to the accompanying drawings. The inventive concept may, however, be embodied in many different forms and should not be construed as limited to only the illustrated embodiments. Rather, these embodiments are provided so that this disclosure will be thorough and complete, and will fully convey the scope of the invention to those skilled in the art. Throughout the drawings and written description, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Those skilled in the art will understand that various JEDEC standards are available that characterize and/or define the structure, constitution and/or operating conditions of eMMCs. These standards may be readily obtained and consulted by recourse to http://www.jedec.org. For example, the embedded multimedia card (eMMC) electrical standard, version 4.51 published June 2012 (i.e., JESD84-B451) contains many terms and technical definitions that are useful to an understanding of the inventive concept.

Various embodiments of the inventive concept may include at least one "additional" signal line or signal wire (hereafter, simply "line") having a specific purpose. This additional line will be additive to the standard 10-wire configuration(s) specified by JEDEC. The provision of an additional line within certain embodiments of the inventive concept increases noise immunity and improves transmission speed for data communicated between a host and a device during a data read operation while operating in a dual data rate (DDR) mode. Those skilled in the art will understand the general technical concepts and design options involved in providing a DDR mode of operation—specifically including so-called "DDR400".

Within various embodiments of the inventive concept, the term "channel" is used to denote a signal path enabling the transmission of one or more electrical signal(s) (e.g., a voltage). As will be understood by those skilled in the art, a channel may include one or more of; circuits acting upon the one or more electrical signal(s), a host pad (and/or pin), an eMMC pad (and/or pin), a line (or collection of lines), a driver—specifically including but not limited to certain differential amplifiers, and a receiver—specifically including but not limited to certain differential amplifiers. Various functions phenomena will be ascribed to channel(s) in the written description that follows.

For example, unless explicitly otherwise described, the propagation delay of a signal communicated via a channel will be a function of the circuit(s), pin(s), pad(s), line(s), driver(s) and/or receiver(s) variously associated with the channel. Expected or inherent propagation delay is a well understood concept, and as such, will not be specifically considered in the written description that follows.

Figure 2:
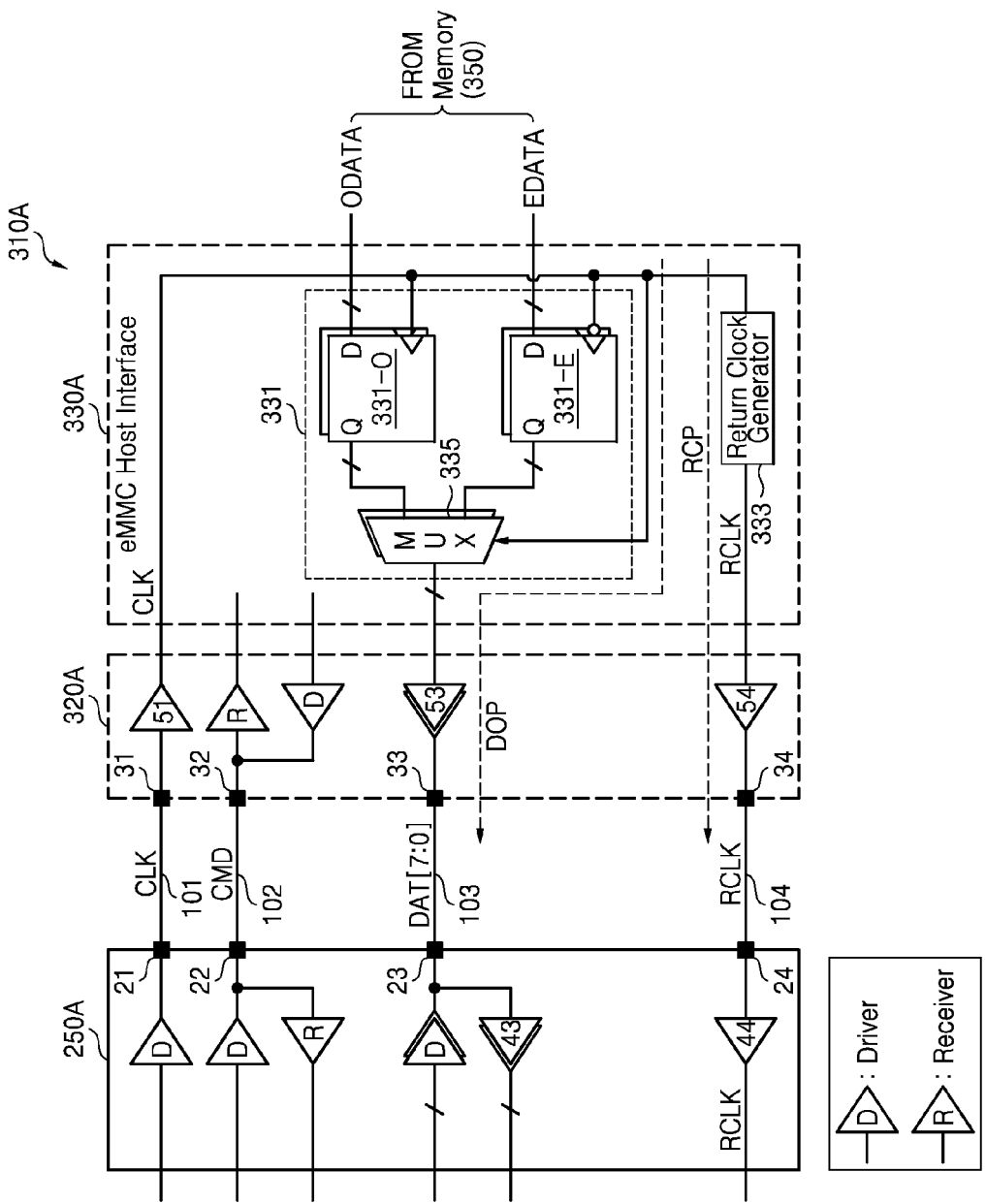
FIGS. 2 and 4 are respective diagrams further illustrating a portion of the eMMC system of FIG. 1 including a return clock generator.

Also, unless explicitly otherwise described, an input signal and output signal for a particular functional circuit may be denoted by the same name. For instance, as shown in FIG. 2, both of the input signal and output signal of each of the functional circuits 54 and 44 are denoted by RCLK.

Figure 28:
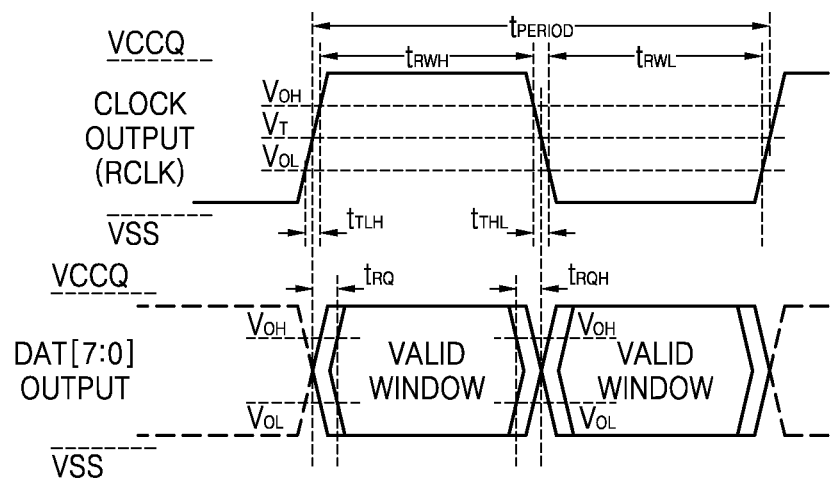
FIG. 28 is a timing chart further illustrating the operation of a DDR device that may be incorporated in certain embodiments of the inventive concept.

An eMMC according to embodiments of the inventive concept transmits a "return clock" signal that is "based on" (i.e., generated in response to) a "clock" signal provided by a host. This return clock may be transmitted (or "returned") to the host via a "return clock bus" during a data read operation performed in accordance with a given DDR operating mode. This type of data read operation will hereafter be referred to as a "DDR read operation". FIG. 28 illustrates a synchronous relationship between the return clock and a "read clock" used to transmit "data" from an eMMC to a host. With this relationship, the host may accurately receive (and/or latch) "read data" provided from the eMMC to the host using the return clock as a strobe signal.

During a DDR read operation, a host and eMMC configured in an "eMMC system" may use differential signaling in order to eliminate or reduce the influence of noise generated by a clock signal. The host and eMMC may also use differential signaling in order to eliminate or reduce noise generated by the return clock.

In addition, during a DDR read operation, the host and eMMC may use a reference voltage in order to reduce skew between the return clock and read clock to thereby maximize the size of each "data valid window" during which read data may be received by the host with a high degree of confidence. These salutary effects may be achieved even in the face of changes in the level of a constituent clock signal and/or change in a detection level for the data that may arise due to power line noise.

In certain embodiments that follow, a DDR400 mode of operation will be redefined in part, and the connective structure(s) enabling DDR400 signaling between a host and an eMMC will be modified in part to support what may be terms a "redefined DDR400 mode". In this context, the DDR400 mode is an operating mode capable of processing data at 200 MHz DDR when an input/output (I/O) operating voltage (VCCQ) of a host or eMMC is 1.2 or 1.8 V as illustrated in the table of FIG. 24.

FIG. 1 is a block diagram of an eMMC system 100A according to an embodiment of the inventive concept. The eMMC system 100A includes a host 200A and a device (or eMMC) 300A.

The host 200A controls data processing operations such as a read/write operations in relation to data stored (or to be stored) in the eMMC. As has already been suggested, data processing operations between the host and connected eMMC may be performed at a single data rate (SDR) or double data rate (DDR).

The host 200A may be one or more data processing device(s), such as a central processing unit (CPU), a processor, a microprocessor, or an application processor, capable of processing data received from the eMMC. A combination of the data processing device and eMMC may be inserted (or "embedded") within an electronic device, such as a personal computer (PC), a laptop computer, a mobile telephone, a smartphone, a tablet PC, a personal digital assistant (PDA), an enterprise digital assistant (EDA), a digital still camera, a digital video camera, an audio device, a portable multimedia player (PMP), a personal navigation device or portable navigation device (PND), an MP3 player, a handheld game console, or an e-book.

In addition to being connected to the host 200A via one or more defined channels, the eMMC 300A may be variously connected with the electronic device.

The host 200A illustrated in FIG. 1 includes a clock generator 210, a processing circuit 212, a state control unit 220, and a host controller 230A.

The clock generator 210 may be used to generate a "clock" signal CLK used by the host 200A and eMMC 300A. In certain embodiments, the clock generator 210 may be implemented as a phase locked loop (PLL) circuit. The processing circuit 212 may be implemented in hardware, software and/or firmware and may be used to generate a command CMD, analyze a response from the eMMC 300A, as well as analyze and/or change data stored in an extended card specific data (CSD) register ("EXT_CSD register") (not shown) of a flash memory 370 of the eMMC 300A. The processing circuit 212 may be used to control operation of the clock generator 210, processing circuit 212, state control unit 220, and host controller 230A.

The state control unit 220 may be used to generate a selection signal SEL in response to a control signal CTR provided by the processing circuit 212. The host controller 230A illustrated in FIG. 1 includes a data I/O circuit 240 and a host I/O block 250A.

During a data write operation, the data I/O circuit 240 transmits "write data" to be written to the flash memory 370 of the eMMC 300A to the host I/O block 250A in response to the clock CLK. During a DDR read operation, the data I/O circuit 240 receives "read data" retrieved from the flash memory 370 through the host I/O block 250A in response to the clock CLK or a return clock RCLK as determined by a selection circuit 245.

The data I/O circuit 240 of FIG. 1 includes a write latch circuit 241 and a read latch circuit 243. The write latch circuit 241 includes first write latches 241-O and second write latches 241-E. The first write latches 241-O latch odd-numbered data in write data to be written to the eMMC 300A in response to a rising edge of the clock CLK. The second write latches 241-E latch even-numbered data in the write data in response to a falling edge of the clock CLK.

The read latch circuit 243 includes first read latches 243-O and second read latches 243-E. The first read latches 243-O latch odd-numbered data in read data output from the eMMC 300A in response to a rising edge of the output signal CLK or RCLK of the selection circuit 245. The second read latches 243-E latch even-numbered data in the read data in response to a falling edge of the output signal CLK or RCLK of the selection circuit 245.

The selection circuit 245 may be implemented by a multiplexer, wherein the multiplexer transmits the clock CLK to the read latch circuit 243 in response to a first (or "low") level the selection signal SEL, or transmits the return clock RCLK to the read latch circuit 243 in response to a second (or "high") level selection signal SEL.

Although the hosts 200A, 200B, 200C, 200D, 200E, 200F, 200G, 200H, 200I and 200J (hereafter, hosts 200A through 200J) respectively illustrated in FIGS. 1, 5, 7, 9, 11, 13, 15, 17, 19, and 21 include the state control unit 220 and the selection circuit 245, this is just one possible design choice, and either one or both of the state control unit 220 and selection circuit 245 may omitted from the hosts 200A through 200J. Where this is the case, the return clock RCLK may be directly applied to the read latch circuit 243 during a DDR read operation. In either event, the first read latches 243-O may be used to latch the odd-numbered data in read data provided by the eMMC 300A in response to a rising edge of the return clock RCLK, and the second read latches 243-E may be used to latch the even-numbered data in the read data in response to a falling edge of the return clock RCLK.

An "eMMC channel" illustrated in FIG. 1 between the host 200A and eMMC 300A includes eleven (11) lines. The eleven lines include a unidirectional clock bus 101 transmitting the clock CLK, a bidirectional command bus 102 transmitting the command CMD from the host 200A to the eMMC 300A, or a response from the eMMC 300A to the host 200A, bidirectional data lines 103 transmitting data DAT[7:0], and a unidirectional return clock line 104 transmitting the return clock RCLK from the eMMC 300A to the host 200A. With this configuration, the eMMC system 100A may use the return clock RCLK to increase the speed and data throughput of a DDR read operation.

The host 200A transmits a hardware reset signal Reset to the eMMC 300A through a reset line. The host 200A generates I/O operating voltages VCCQ and VSSQ used in I/O blocks 250A and 320A and transmits the I/O operating voltages VCCQ and VSSQ to the eMMC 300A through power lines. At this time, a driver (including a differential amplifier in some embodiments) and a receiver (including a differential amplifier in some embodiments) of the I/O blocks 250A and 320A use the I/O operating voltages VCCQ and VSSQ as operating voltages.

The host 200A also generates core operating voltages VCC and VSS for the flash memory 370 and transmits the core operating voltages VCC and VSS to the eMMC 300A through core power lines. In certain embodiments, the voltages VSSQ and VSS are ground voltage.

In eMMC systems 100A, 100B, 100C, 100D, 100E, 100F, 100G, 100H, 100I, AND 100J (hereafter, eMMC systems 100A through 100J), the reset signal Reset, the I/O operating voltages VCCQ and VSSQ, as well as the core operating voltages VCC and VSS are provided by from the respective hosts 200A through 200J to the respective eMMCs 300A through 300J, but the scope of the inventive concept is not limited to this particular configuration.

The structure and operation of the host I/O block 250A and the eMMC I/O block 320A will be described in some detail with reference to FIG. 2 hereafter.

In FIG. 1, the device (eMMC 300A) includes a device controller (eMMC controller 310A) and the flash memory 370. The eMMC controller 310A controls data communication between the host 200A and the flash memory 370. The eMMC controller 310A includes the eMMC I/O block 320A, an eMMC host interface 330, a CPU 340, a memory 350, and a flash interface 360.

During a DDR400 operating mode, for example, the eMMC host interface 330 receives the clock CLK and the command CMD through the eMMC I/O block 320A, generates the return clock RCLK based on the clock CLK, transmits the return clock RCLK to the eMMC I/O block 320A, analyzes the command CMD, generates a response according to an analysis result, and transmits a response to the eMMC I/O block 320A. In addition, the eMMC host interface 330 may be used to transmit data stored in an EXT_CSD register of the flash memory 370 to the eMMC I/O block 320A according to a particular command CMD (e.g., a SEND_EXT_CSD command (=CMD8)) provided from the host 200A.

During a data write operation, the eMMC host interface 330 temporarily stores the data DAT[7:0] received through the eMMC I/O block 320A in the memory 350 (e.g., a buffer) in accordance with the clock CLK and under the control of the CPU 340. Also during a data write operation, the flash interface 360 reads the data DAT[7:0] from the memory 350 and writes the data DAT[7:0] to the flash memory 370 under the control of the CPU 340.

During a data read operation, the flash interface 360 stores data output from the flash memory 370 in the memory 350 according to the control of the CPU 340, and the eMMC host interface 330 reads the data DAT[7:0] from the memory 350 and transmits the data DAT[7:0] to the eMMC I/O block 320A using the clock CLK according to the control of the CPU 340.

The CPU 340 controls the operation of the interfaces 330 and 360 as well as the overall operation of the eMMC 300A. The memory 350 temporarily stores data transferred between the interfaces 330 and 360, wherein the memory 350 may be implemented using volatile memory.

When the flash memory 370 is implemented using NAND flash memory, the flash interface 360 may be implemented as a corresponding NAND flash interface.

Figure 3:
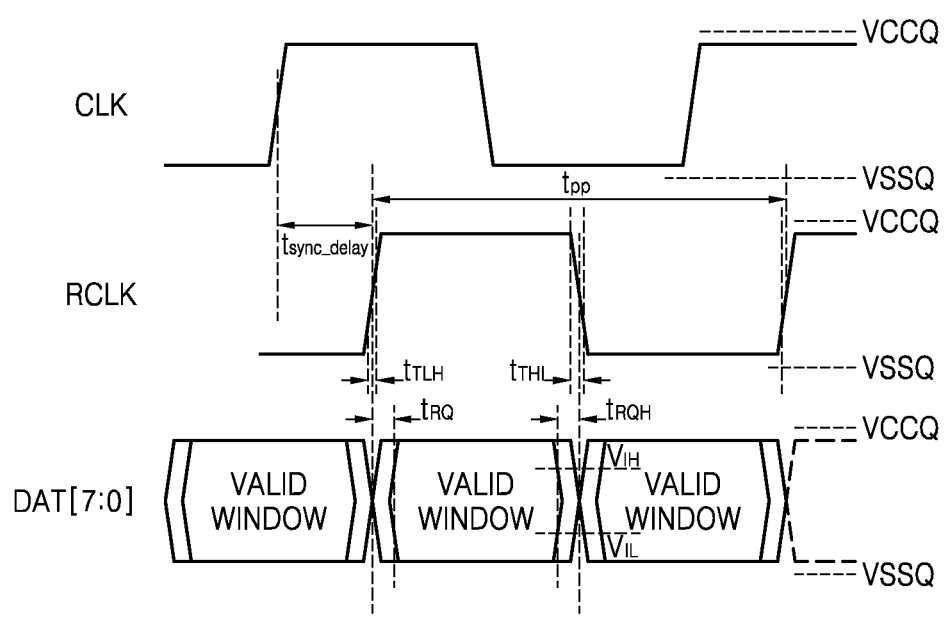
FIG. 3 is a waveform diagram showing a clock, a return clock, and data according to certain embodiments of the inventive concept.

FIG. 2 is a diagram further illustrating a portion of the eMMC system 100A of FIG. 1 including a return clock generator 333 according to certain embodiments of the inventive concept. FIG. 3 is a waveform diagram illustrating the clock CLK, return clock RCLK, and the data DAT[7:0] signal(s) according to certain embodiments of the inventive concept.

Referring to FIGS. 1 and 2, the host I/O block 250A includes drivers D, receivers R (e.g., 43 and 44), and host pads 21 through 24. The eMMC I/O block 320A includes eMMC pads 31 through 34, receivers R (e.g., 51), and drivers D (e.g., 53, and 54).

An eMMC host interface 330A, an example of the eMMC host interface 330 illustrated in FIG. 1, includes a data transmission circuit 331 and the return clock generator 333.

During a data read operation, first data output latches 331-O latch odd-numbered data ODATA among data output from the memory 350 in response to a rising edge of the clock CLK output from the receiver 51. During a data read operation, second data output latches 331-E latch even-numbered data EDATA among the data output from the memory 350 in response to a falling edge of the clock CLK output from the receiver 51.

A first selection circuit 335 outputs the odd-numbered data ODATA latched by the first data output latches 331-O to the eMMC data drivers 53 in response to a rising edge of the clock CLK and outputs the even-numbered data EDATA latched by the second data output latches 331-E to the eMMC data drivers 53 in response to a falling edge of the clock CLK. The first selection circuit 335 may be implemented by a multiplexer.

The odd-numbered data ODATA and the even-numbered data EDATA, which are sequentially output from the eMMC data drivers 53, are transmitted to the read latch circuit 243 through the components 33, 103, 23, and 43.

Only during a DDR read operation, the return clock generator 333 generates the return clock RCLK based on the clock CLK output from the receiver 51. The return clock generator 333 may be implemented using delay logic. The delay period provided by the delay logic may be adjusted or variously programmed.

When the delay (or latency) of a data output path DOP including the data transmission circuit 331 is designed or adjusted to be the same as that of a return clock output path RCP including the return clock generator 333, as shown for example in FIG. 3 or FIG. 28 the return clock generator 333 may transmit the return clock RCLK synchronously with the data DAT[7:0] to the host I/O block 250A through the components 54, 34, and 104.

The receiver 44 may be used to transmit the return clock RCLK to the read latch circuit 243 directly or through the selection circuit 245. Thus, during a DDR read operation, the return clock RCLK may essentially be used as a strobe signal controlling the high-speed transfer of data read.

As shown in FIG. 3 or FIG. 28, the edges of the return clock RCLK are synchronous with the edges of the parallel data DAT[7:0]. As previously noted, the parallel data DAT[7:0] may be transmitted according to a 200 Mhz clock DDR.

As described above, from the viewpoint of the eMMC pads 33 and 34, the return clock generator 333 delays the clock CLK by a predetermined delay period, thereby generating the return clock RCLK synchronously with the parallel data DAT[7:0]. Accordingly, the eMMC 300A reduces a potential timing skew between the parallel data DAT[7:0] and the return clock RCLK, thereby securing a maximum sized data valid window. In FIG. 3, $t_{sync\_delay}$ denotes a delay period or latency that is provided to synchronize the return clock RCLK with the parallel data DAT[7:0]. This delay period may be adjusted using the return clock generator 333.

The various terms and denotations used in FIGS. 3, 28, and 29 may be understood from the exemplary list shown in FIG. 29.

Here, $t_{RQ}$ and $t_{RQH}$ denote certain timing parameters for the data DAT[7:0] provided to the host 200A, and may be used to understand the possible timing skew between the parallel data DAT[7:0] and the return clock RCLK. In other words, $t_{RQ}$ denotes an output hold skew, while $t_{RQH}$ denotes an output hold time.

The output hold skew $t_{RQ}$ is a restriction that holds data until an edge of the return clock RCLK occurs and the output hold time $t_{RQH}$ is a restriction on time taken till the data should be normal since the edge of the return clock RCLK occurs. $V_{IH}$ denotes an input high voltage and $V_{IL}$ denotes an input low voltage.

As shown in FIG. 28, during the DDR400 mode of operation for example, the return clock RCLK may be used to read data. That is, it may be used for block oriented data reads or cyclic redundancy check (CRC) status response reads. During a data write operation, or while the eMMC 300A is idle, the state of the return clock RCLK, or better expressed, the state of the return clock line 104 transmitting the return clock RCLK may be maintained in a high-impedance (high-Z) state.

During the DDR read operation, the return clock RCLK is toggled synchronously with a data valid period.

The eMMC 300A may variously set the state of the return clock RCLK. For example, the eMMC 300A may set the return clock RCLK to a default level using a pull-down circuit.

Figure 4:
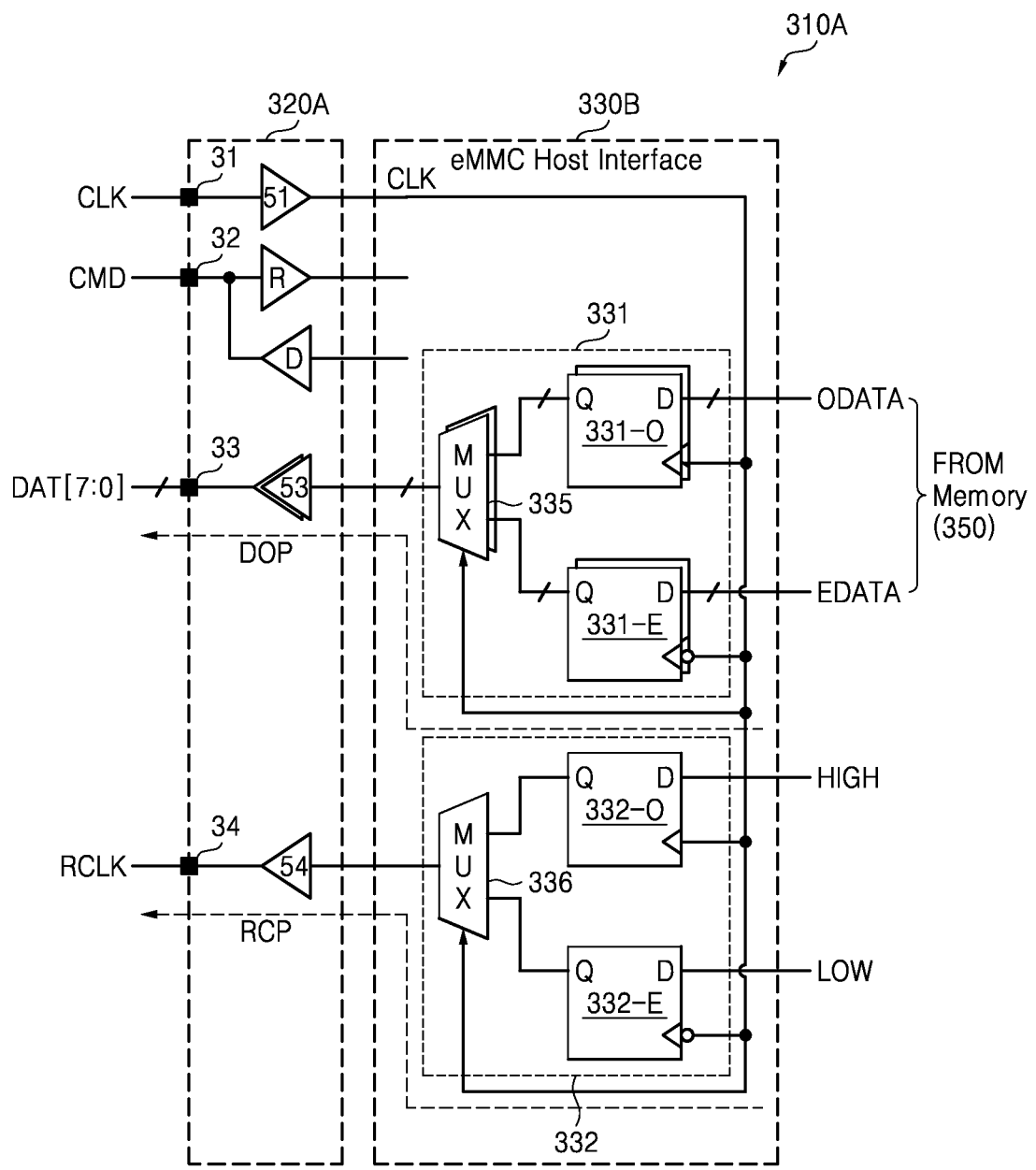

FIG. 4 is a diagram further illustrating a portion of the eMMC system 100A of FIG. 1 including a return clock generator 332 according to other embodiments of the inventive concept. Referring to FIG. 4, the eMMC controller 310A includes the eMMC I/O block 320A and an eMMC host interface 330B. The eMMC host interface 330B—another example of the eMMC host interface 330 illustrated in FIG. 1—includes the data transmission circuit 331 and the return clock generator 332.

The structure and operation of the data transmission circuit 331 illustrated in FIG. 4 may be substantially the same as those previously described with reference to FIG. 2. Here, the phrase "substantially the same" means being physically the same, and/or being the same with consideration of process variations, e.g., process, voltage and temperature (PVT) variations.

The return clock generator 332 includes latches 332-O and 332-E and a second selection circuit 336. The first latch 332-O latches a logical "high" level (HIGH) in response to a rising edge of the clock CLK output from the receiver 51 and the second latch 332-E latches a logical "low" level (LOW) in response to a falling edge of the clock CLK output from the receiver 51. For instance, the high level may correspond to the I/O operating voltage VCCQ and the low level may correspond to the I/O operating voltage VSSQ.

The second selection circuit 336 outputs the high level latched by the first latch 332-O to the driver 54 in response to a rising edge of the clock CLK output from the receiver 51. Also, the second selection circuit 336 outputs the low level latched by the second latch 332-E to the driver 54 in response to a falling edge of the clock CLK output from the receiver 51. The second selection circuit 336 may be implemented by a multiplexer.

The driver 54 transmits the return clock RCLK output from the return clock generator 332 to the eMMC pad 34. In other words, the structure of the data output path DOP is substantially the same as that of the return clock output path RCP. Accordingly, the any potential timing skew between the parallel data DAT[7:0] and the return clock RCLK may be eliminated or markedly reduced.

As shown in FIG. 3 or 28, from the viewpoint of the eMMC pads 33 and 34, the edges of the parallel data DAT[7:0] output by the eMMC controller 310A illustrated in FIG. 4 are synchronous with the edges of the return clock RCLK.

Figure 5:
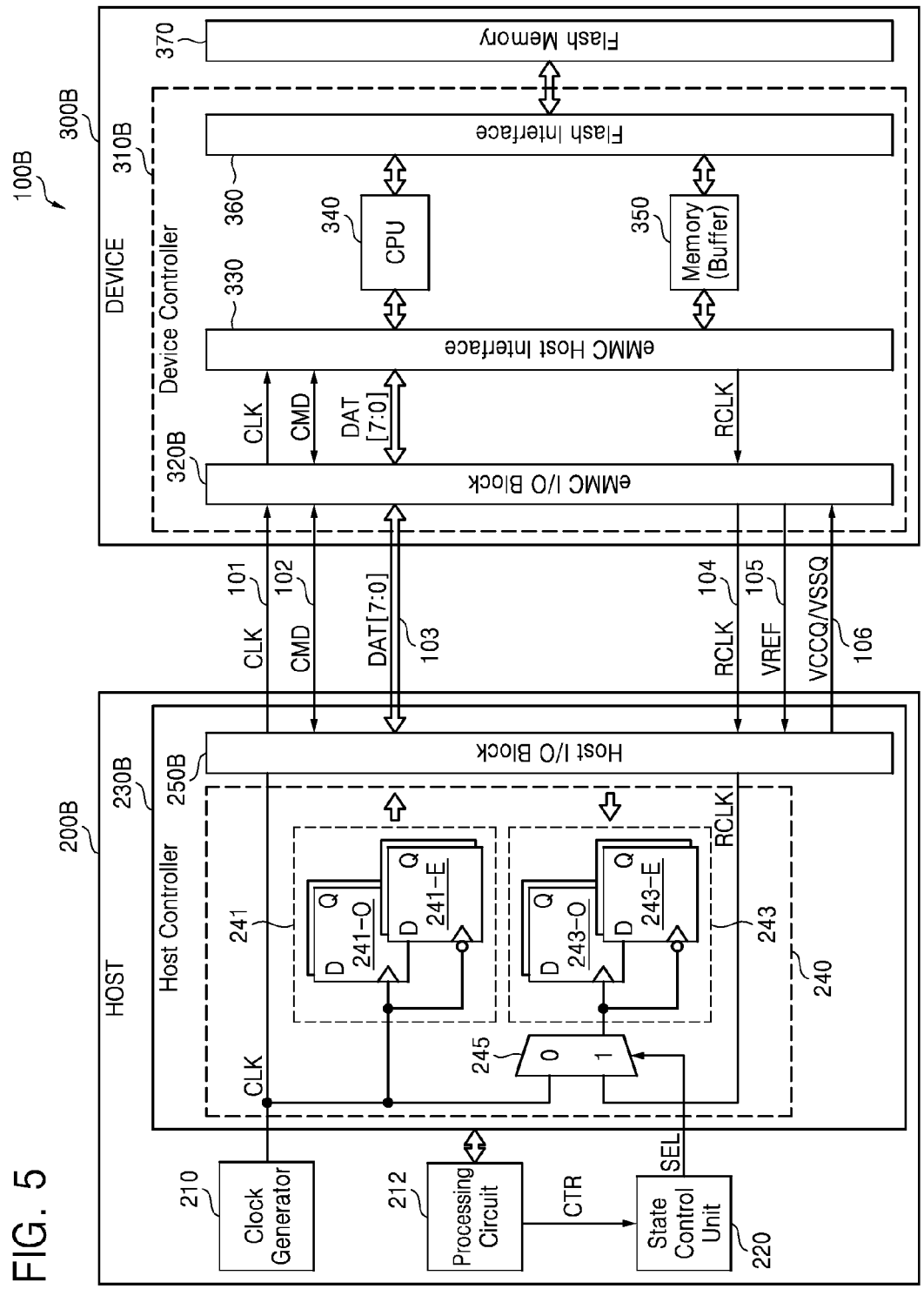

FIG. 5 is a block diagram of an eMMC system 100B according to another embodiment of the inventive concept. Referring to FIG. 5, the eMMC system 100B generally includes a host 200B and a device (an eMMC) 300B.

The structure and operation of the eMMC system 100B illustrated in FIG. 5 are substantially the same as those described in relation to the eMMC system 100A of FIG. 1, except for the structure and operation of a host I/O block 250B in a host controller 230B and the structure and operation of an eMMC I/O block 320B in an eMMC controller 310B. Apart from the return clock line 104, a reference voltage line 105 is additionally provided between the host I/O block 250B and the eMMC I/O block 320B.

Figure 6:
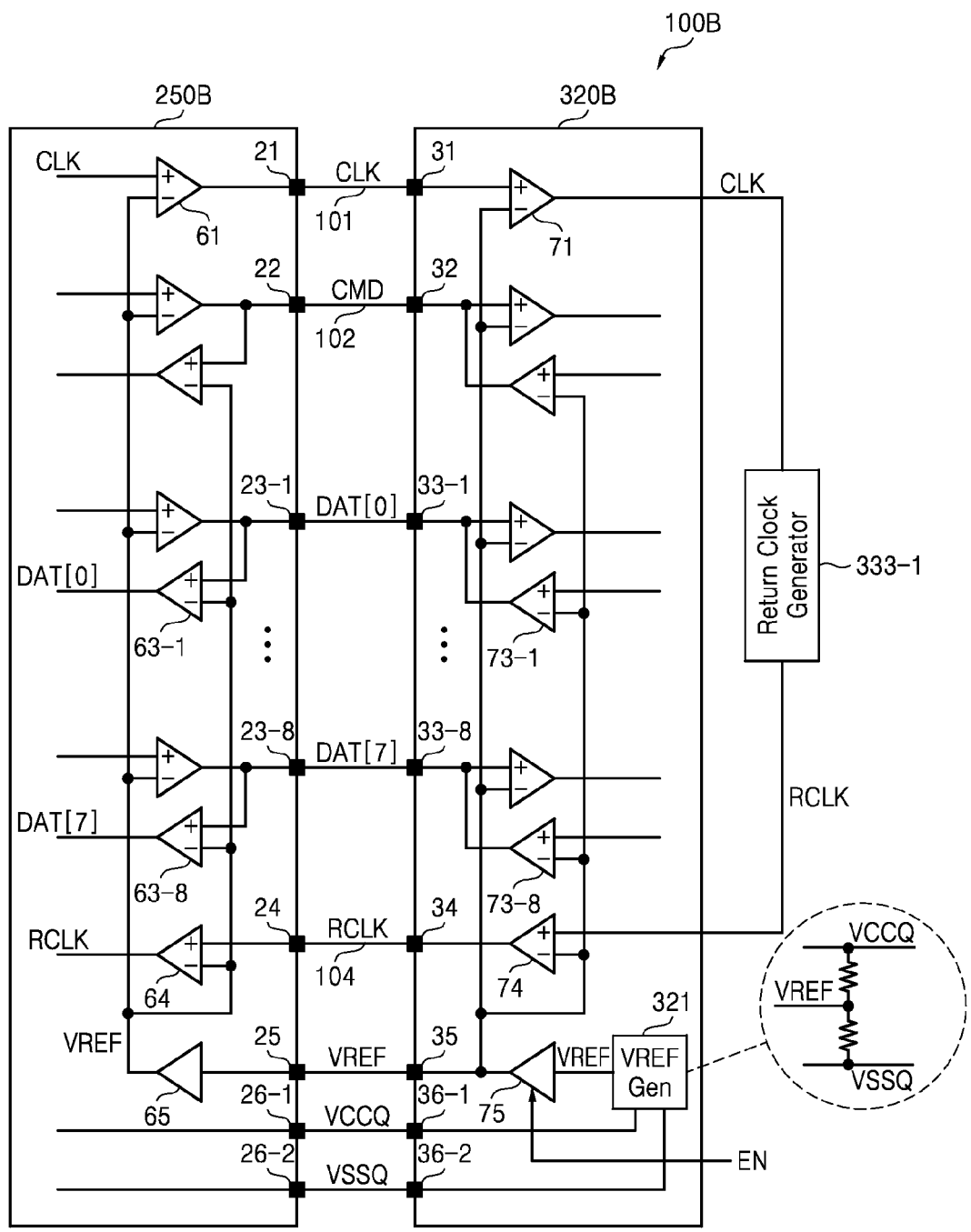
FIG. 6 is a diagram further illustrating the input/output (I/O) blocks of the eMMC system of FIG. 5.

FIG. 6 is a diagram further illustrating the I/O blocks 250B and 320B of the eMMC system 100B of FIG. 5. Referring to FIG. 6, a driver and receiver included in the host I/O block 250B may be implemented using a differential amplifier that amplifies an input signal based on a reference voltage VREF. Further, a driver and receiver included in the eMMC I/O block 320B may also be implemented using a differential amplifier that amplifies an input signal based on the voltage reference VREF.

During a DDR read operation, the reference voltage VREF is generated using the I/O operating voltages VCCQ and VSSQ applied to the I/O blocks 250B and 320B.

The reference voltage VREF is used as a reference signal for distinguishing a low level from a high level with respect to a signal input to a driver or a receiver. Accordingly, the differential amplifier is insensitive to power line noise and is able to accurately sense and amplify the input signal.

As shown in FIGS. 5 and 6, the eMMC 300B may generate the reference voltage VREF as a function of the I/O operating voltages VCCQ and VSSQ. The I/O operating voltages VCCQ and VSSQ provided from the host 200B are applied to a reference voltage generator 321 through components 26-1, 26-2, 106, 36-1, and 36-2. The reference voltage generator 321 generates the reference voltage VREF using the I/O operating voltages VCCQ and VSSQ and transmits the reference voltage VREF to a driver 75.

The reference voltage VREF may be generated using a voltage divider in certain embodiments of the inventive concept. As shown in FIG. 6, the reference voltage generator 321 may generate the reference voltage VREF (=VCCQ/2) corresponding to half of the I/O operating voltage VCCQ. The reference voltage VREF may be a DC voltage corresponding to half of the swing range (VCCQ-VSSQ) of the clock CLK. A level of the reference voltage VREF generated by the reference voltage generator 321 may be adjusted.

The reference voltage VREF output from the driver 75 is transmitted to a receiver 65 through components 35, 105, and 25. The driver 75 may be implemented to operate in response to an enable signal EN output from the eMMC host interface 330.

A differential amplifier 71 amplifies a difference between the reference voltage VREF and the clock CLK and outputs the amplified clock CLK. Differential amplifiers 73-1 through 73-8 respectively amplify differences between the reference voltage VREF and the respective parallel data DAT[0] through DAT[7] output from the memory 350 and respectively transmit the amplified parallel data DAT[0] through DAT[7] to host pads 23-1 through 23-8 (collectively denoted by 23) through eMMC pads 33-1 through 33-8 (collectively denoted by 33) and the data bus 103.

A return clock generator 333-1 generates the return clock RCLK using the clock CLK output from the differential amplifier 71. The return clock generator 333-1 may be implemented by the return clock generator 333 illustrated in FIG. 2 or return clock generator 332 illustrated in FIG. 4. The return clock generator 333-1 may be implemented in the eMMC host interface 330.

A differential amplifier 74 amplifies a difference between the return clock RCLK and the reference voltage VREF and outputs the return clock RCLK to the eMMC pad 34 according to an amplification result. The return clock RCLK output through the eMMC pad 34 is applied to a differential amplifier 64 through the return clock bus 104 and the host pad 24. The differential amplifier 64 amplifies a difference between the return clock RCLK and the reference voltage VREF and outputs the amplified return clock RCLK to the read latch circuit 243.

Differential amplifiers 63-1 through 63-8 included in the host I/O block 250B respectively amplify differences between the reference voltage VREF and the respective data DAT[0] through DAT[7] input through the host pads 23-1 through 23-8 and respectively output the amplified data DAT[0] through DAT[7] to the read latch circuit 243. A differential amplifier 61 amplifies a difference between the reference voltage VREF and the clock CLK and outputs the amplified clock CLK to the differential amplifier 71 through the components 21, 101, and 31.

Figure 7:
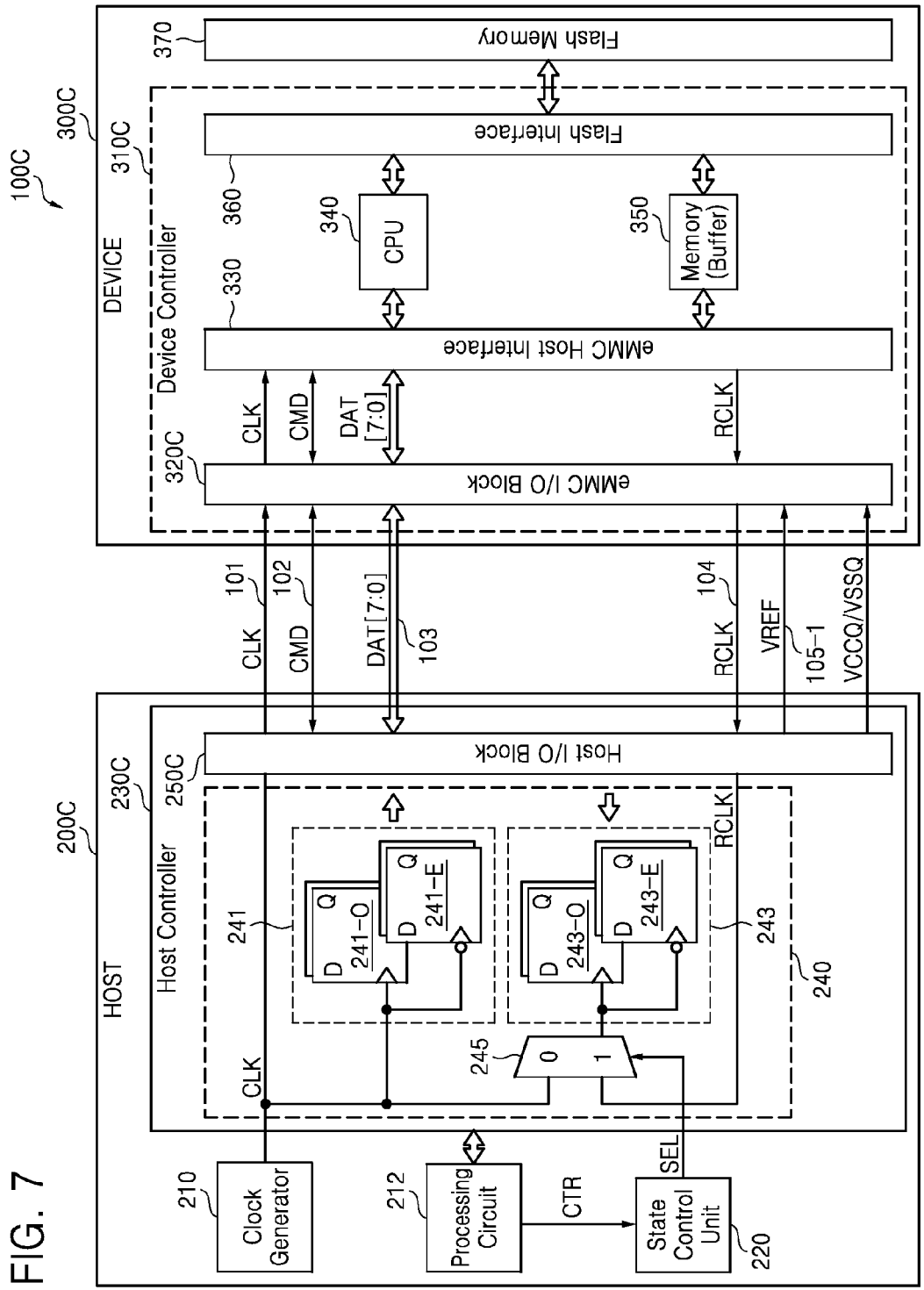
Figure 8:
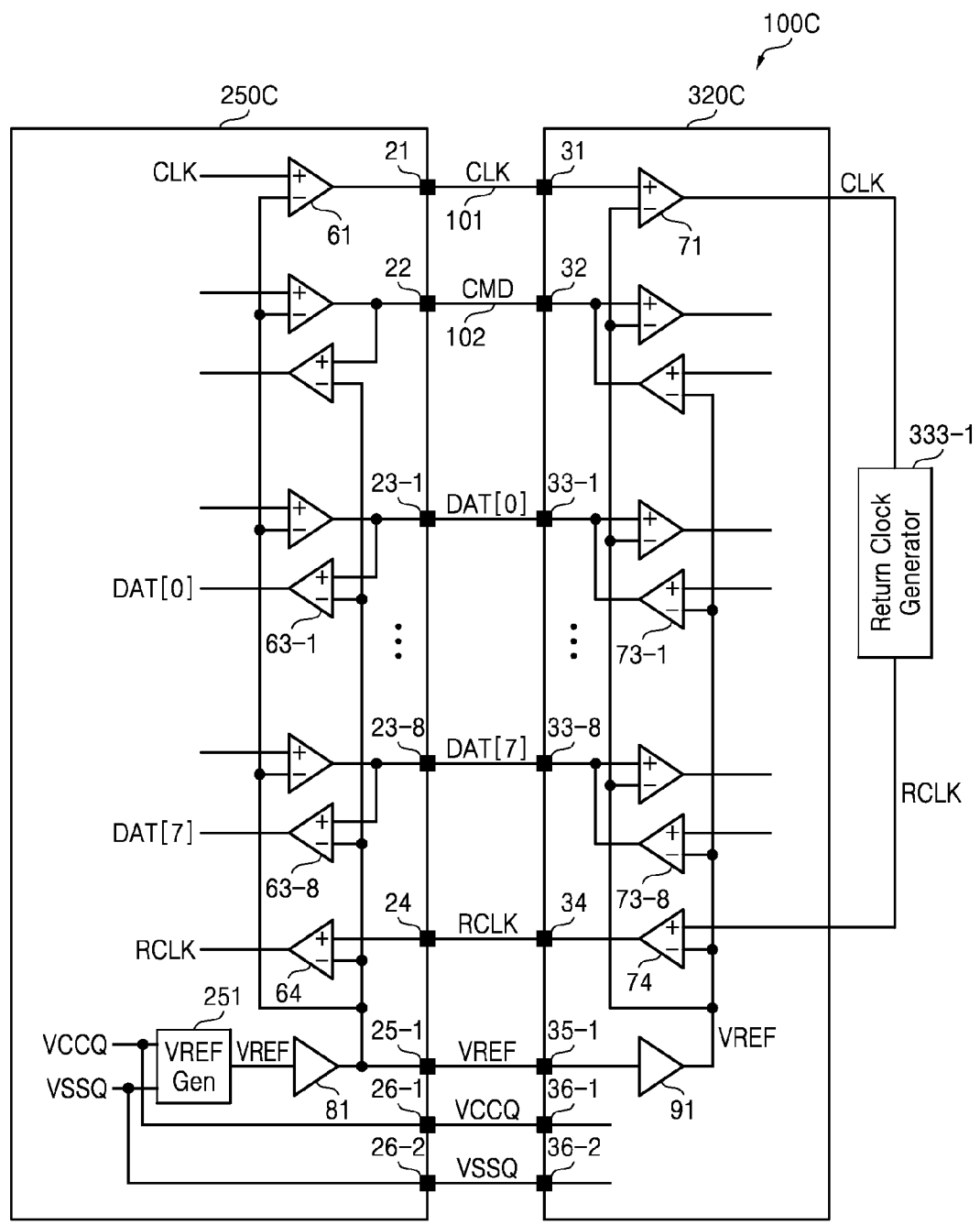
FIG. 8 is a diagram further illustrating the I/O blocks of the eMMC system of FIG. 7.

FIG. 7 is a block diagram of an eMMC system 100C according to still another embodiment of the inventive concept. FIG. 8 is a diagram further illustrating the I/O blocks 250C and 320C of the eMMC system 100C of FIG. 7. Referring to FIG. 7, the eMMC system 100C includes a host 200C and a device (eMMC) 300C.

The structure and operation of the eMMC system 100C illustrated in FIG. 7 are substantially the same as those described in relation to the eMMC system 100A of FIG. 1, except for the structure and operation of the host I/O block 250C in a host controller 230C and the structure and operation of the eMMC I/O block 320C in an eMMC controller 310C.

While the reference voltage VREF is provided from the eMMC 300B to the host 200B through the reference voltage line 105 in the eMMC system 100B illustrated in FIG. 5, the reference voltage VREF is provided from the host 200C to the eMMC 300C through a reference voltage line 105-1 in the eMMC system 100C of FIG. 7. Apart from the return clock line 104, the reference voltage line 105-1 is additionally provided between the host I/O block 250C and the eMMC I/O block 320C.

Although a reference voltage generator 251 is within the host I/O block 250C in FIG. 8 for convenience' sake in the description, it may be implemented outside the host I/O block 250C.

The reference voltage generator 251 generates the reference voltage VREF based on the I/O operating voltages VCCQ and VSSQ. The reference voltage VREF may be generated using a voltage divider. The reference voltage generator 251 may generate the reference voltage VREF (=VCCQ/2) corresponding to half of the I/O operating voltage VCCQ.

A driver 81 transmits the reference voltage VREF to a receiver 91 through components 25-1, 105-1, and 35-1.

The differential amplifier 61 amplifies a difference between the clock CLK and the reference voltage VREF and transmits the amplified clock CLK to the differential amplifier 71 through the components 21, 101, and 31. The differential amplifier 71 amplifies a difference between the reference voltage VREF output from the receiver 91 and the clock CLK output from the eMMC pad 31 and outputs the amplified clock CLK.

Figure 9:
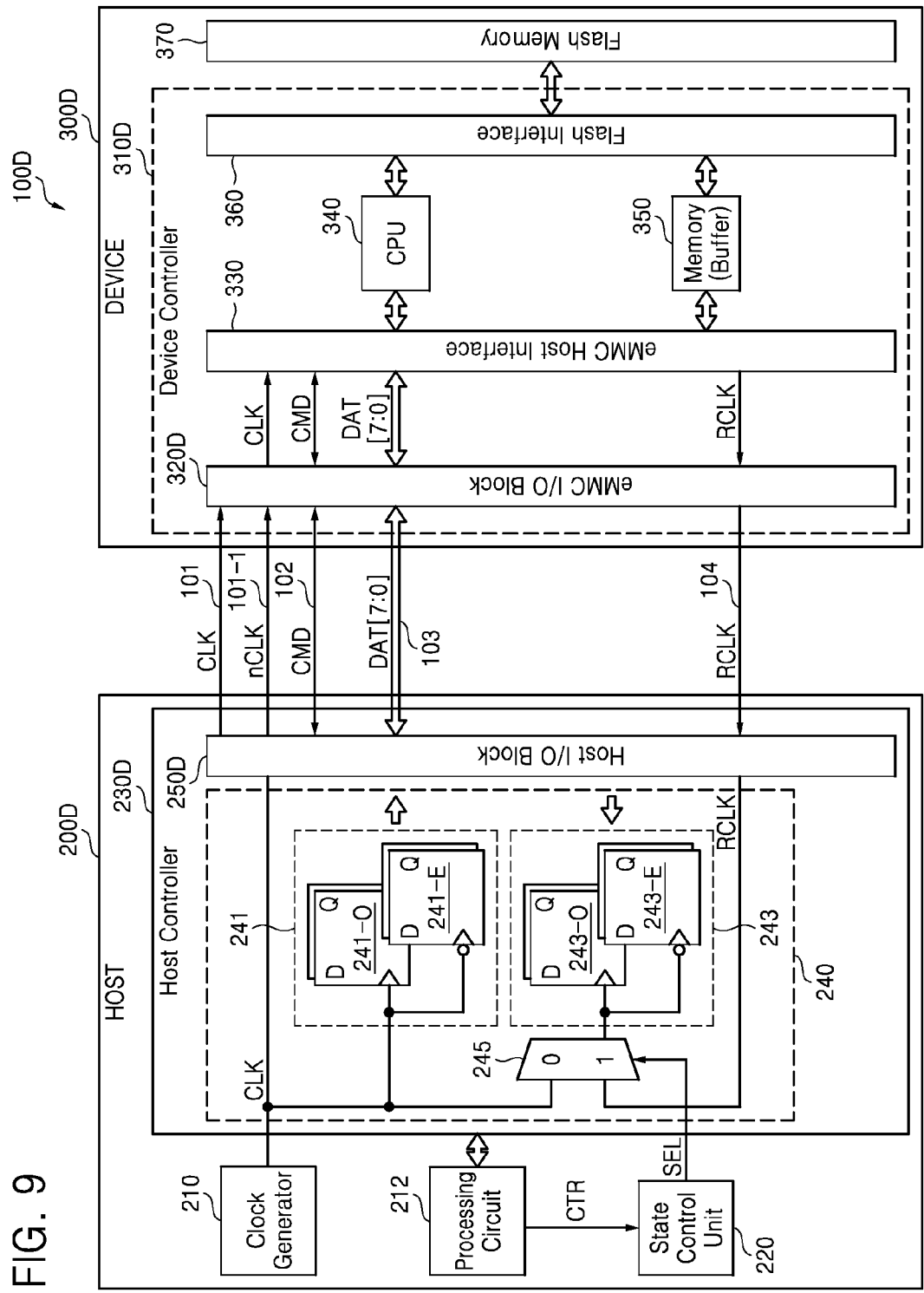
Figure 10:
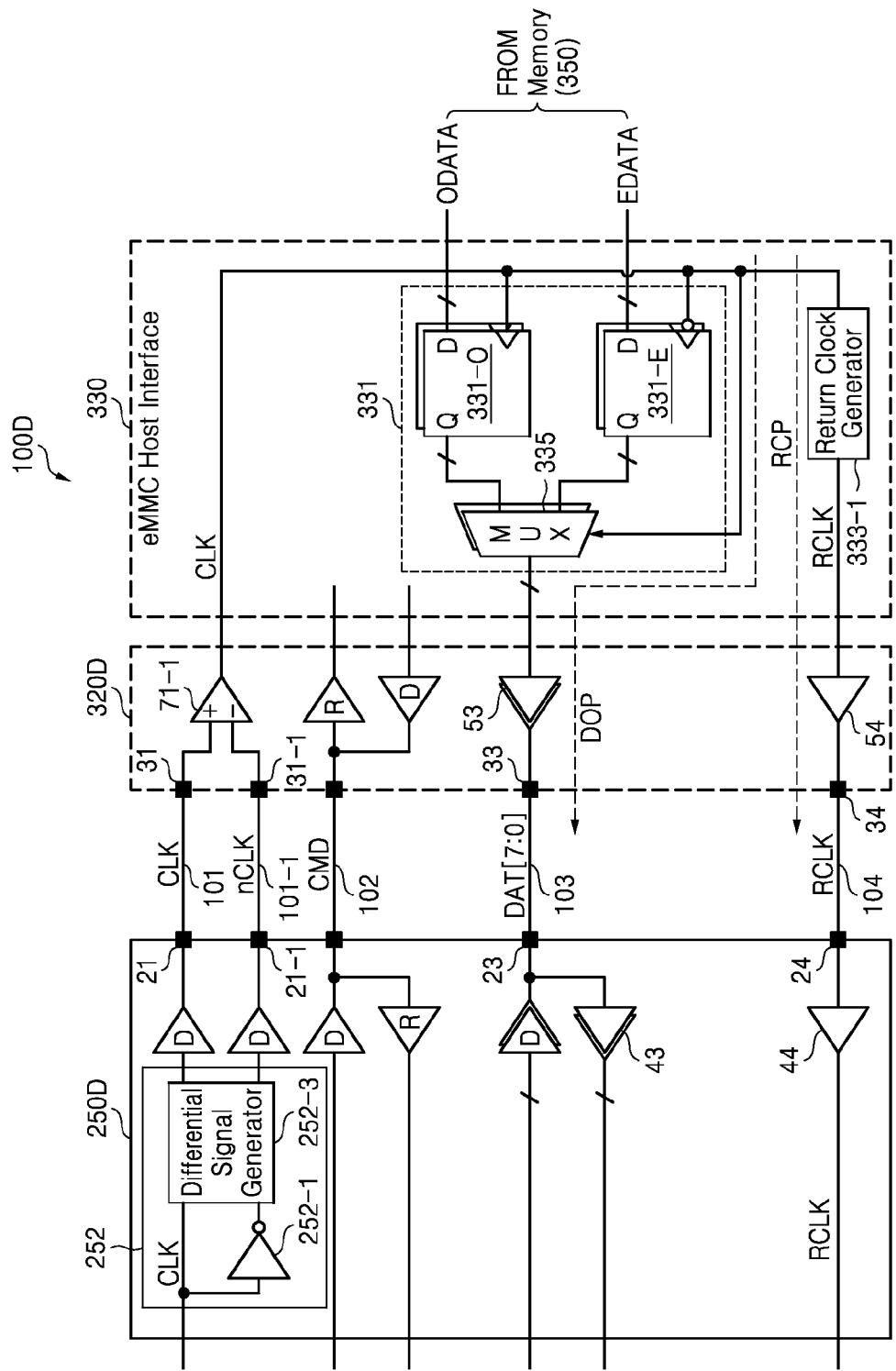
FIG. 10 is a diagram further illustrating the I/O blocks of the eMMC system of FIG. 9.

FIG. 9 is a block diagram of an eMMC system 100D according to still another embodiment of the inventive concept. FIG. 10 is a diagram further illustrating the I/O blocks 250D and 320D of the eMMC system 100D of FIG. 9. Referring to FIG. 9, the eMMC system 100D includes a host 200D and a device (eMMC) 300D.

The structure and operation of the eMMC system 100D of FIG. 9 are substantially the same as those described in relation to the eMMC system 100A of FIG. 1, except for the structure and operation of the host I/O block 250D in a host controller 230D, and the structure and operation of the eMMC I/O block 320D in an eMMC controller 310D. Apart from the return clock line 104, a complementary clock line 101-1 is additionally provided between the host I/O block 250D and the eMMC I/O block 320D.

Thus, the eMMC system 100D of FIG. 9 uses a differential signaling architecture in order to eliminate or reduce the influence of noise occurring due to the clock CLK. That is, the host 200D respectively transmits the clock CLK and a complementary clock nCLK having an opposite phase to that of the clock CLK to the eMMC 300D via the clock lines 101 and 101-1.

The host I/O block 250D illustrated in FIG. 9 includes a differential clock generator 252 that generates the differential clocks CLK and nCLK. Referring to FIG. 10, the differential clock generator 252 of the host I/O block 250D includes an inverter 252-1 inverting the clock CLK and a differential signal generator 252-3 generating the differential clocks CLK and nCLK in response to the clock CLK and an output signal of the inverter 252-1.

The differential clocks CLK and nCLK are provided to a differential amplifier 71-1 through drivers D, host pads 21 and 21-1, clock buses 101 and 101-1, and eMMC pads 31 and 31-1. The return clock generator 333-1 generates the return clock RCLK using the clock CLK output from the differential amplifier 71-1. The return clock generator 333-1 may be implemented by the return clock generator 333 illustrated in FIG. 2 or the return clock generator 332 illustrated in FIG. 4.

Figure 11:
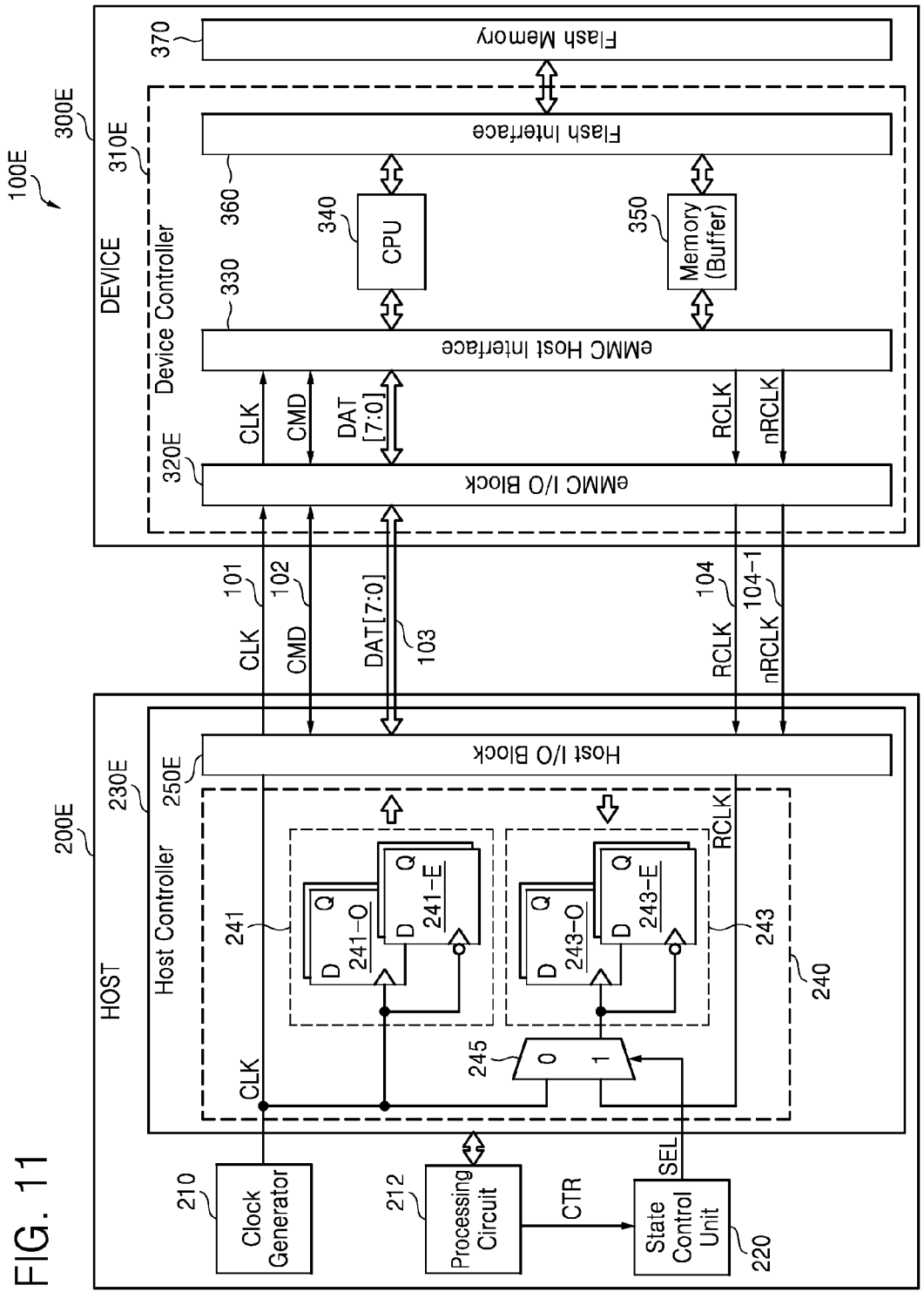
Figure 12:
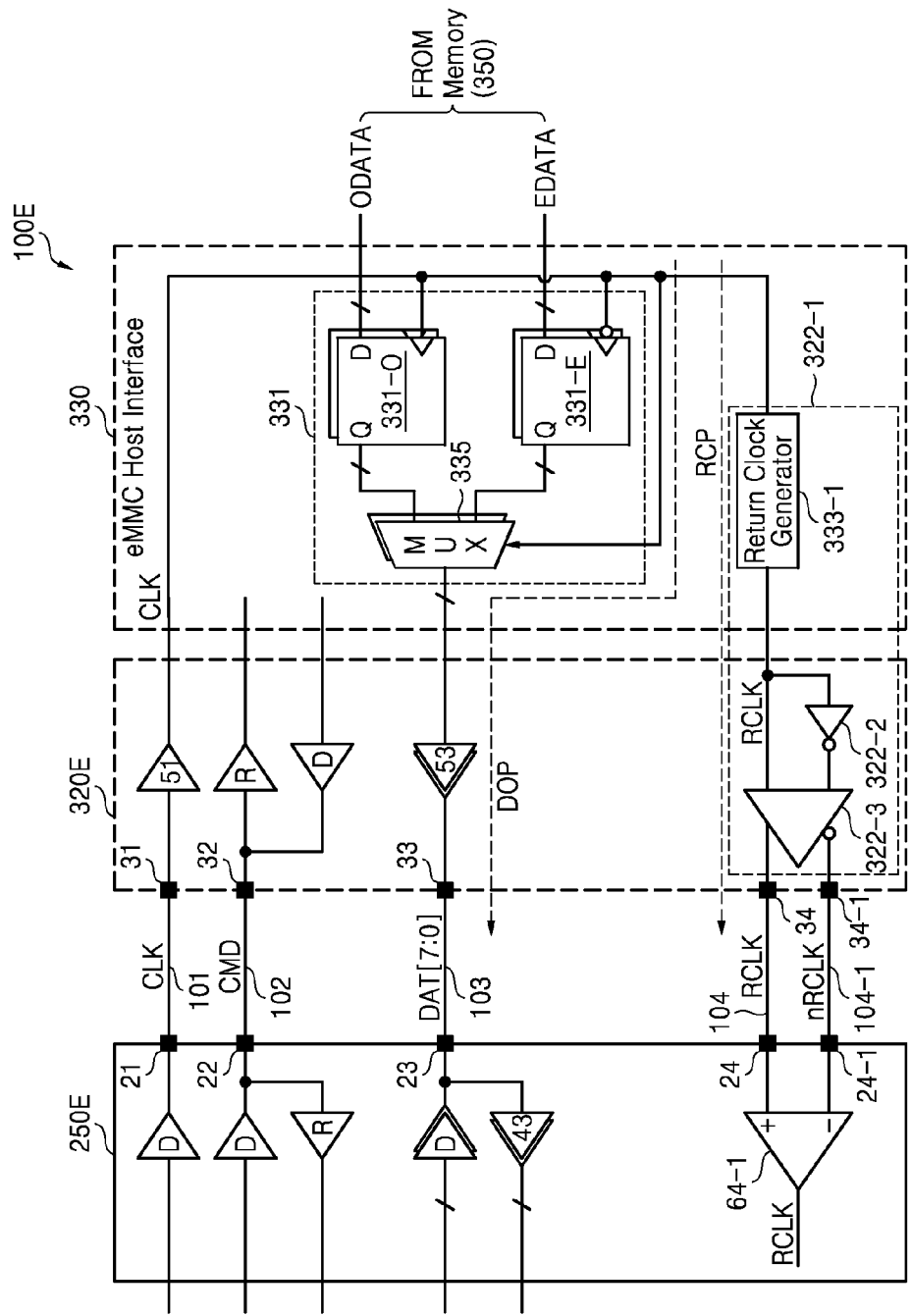
FIG. 12 is a diagram further illustrating the I/O blocks of the eMMC system of FIG. 11.

FIG. 11 is a block diagram of an eMMC system 100E according to still another embodiment of the inventive concept. FIG. 12 is a diagram further illustrating the I/O blocks 250E and 320E of the eMMC system 100E of FIG. 11. Referring to FIG. 11, the eMMC system 100E includes a host 200E and a device (eMMC) 300E.

The structure and operation of the eMMC system 100E illustrated in FIG. 11 are substantially the same as those described in relation to the eMMC system 100A of FIG. 1, except for the structure and operation of the host I/O block 250E in a host controller 230E, and the structure and operation of the eMMC I/O block 320E in an eMMC controller 310E. Apart from the return clock line 104, a complementary return clock line 104-1 is additionally provided between the host I/O block 250E and the eMMC I/O block 320E.

The eMMC system 100E illustrated in FIG. 11 also uses a differential signaling architecture in order to eliminate or reduce the influence of noise occurring due to the return clock RCLK. That is, the eMMC 300E respectively transmits the return clock RCLK and a complementary return clock nRCLK to the host 200E via the return clock lines 104 and 104-1.

The eMMC I/O block 320E of FIG. 11 includes a differential return clock generator 322-1 that generates the differential return clocks RCLK and nRCLK. Referring to FIG. 12, the differential return clock generator 322-1 of the eMMC controller 310E includes the return clock generator 333-1, an inverter 322-2, and a differential amplifier 322-3.

The return clock generator 333-1 generates the return clock RCLK based on the clock CLK output from the receiver 51. The inverter 322-2 inverts the return clock RCLK. The differential amplifier 322-3 generates the differential return clocks RCLK and nRCLK based on the return clock RCLK and an output signal of the inverter 322-2. The differential return clocks RCLK and nRCLK are transmitted to a differential amplifier 64-1 through components 34, 34-1, 104, 104-1, 24, and 24-1. The differential amplifier 64-1 amplifies a difference between the differential return clocks RCLK and nRCLK and transmits the amplified return clock RCLK to the read latch circuit 243.

Figure 13:
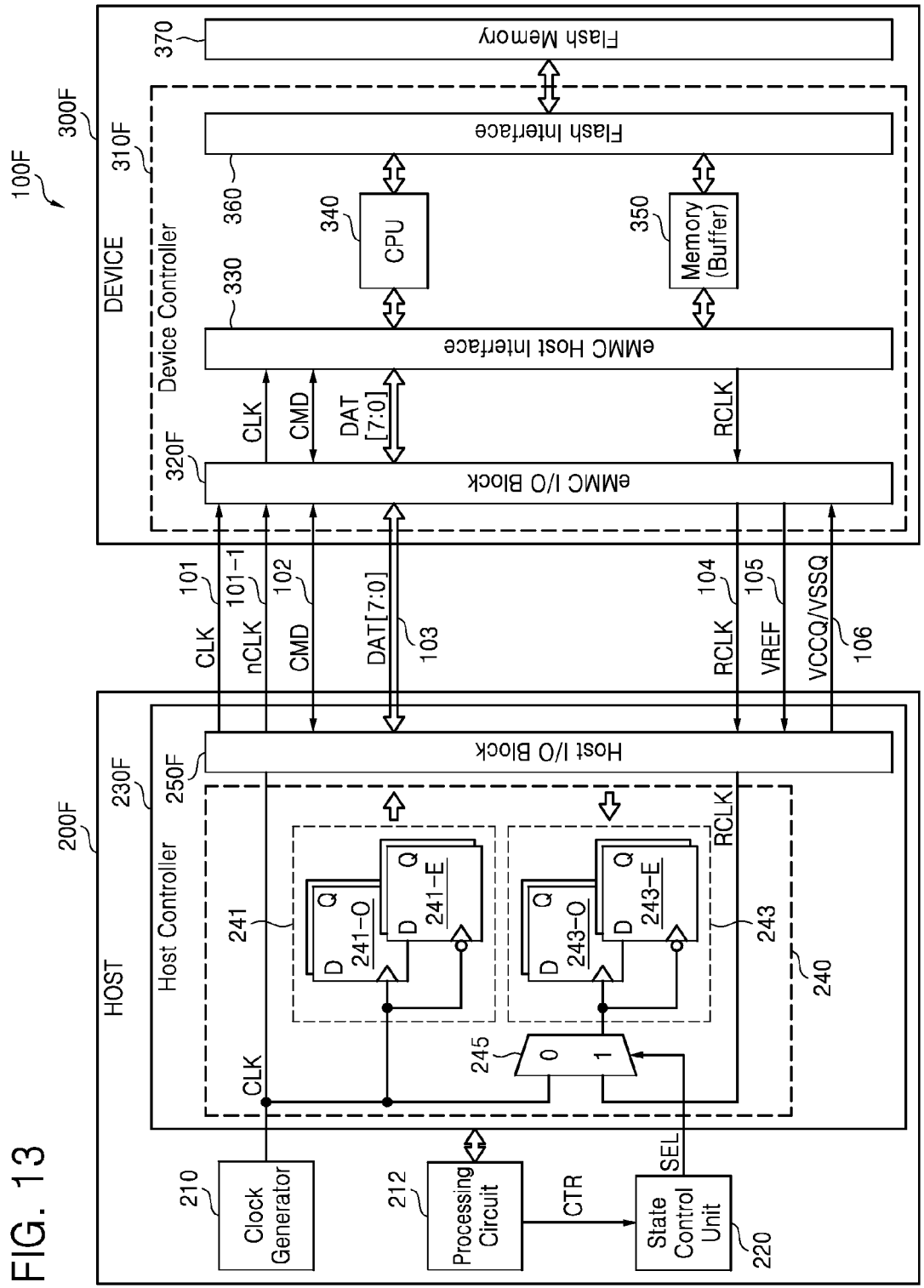
Figure 14:
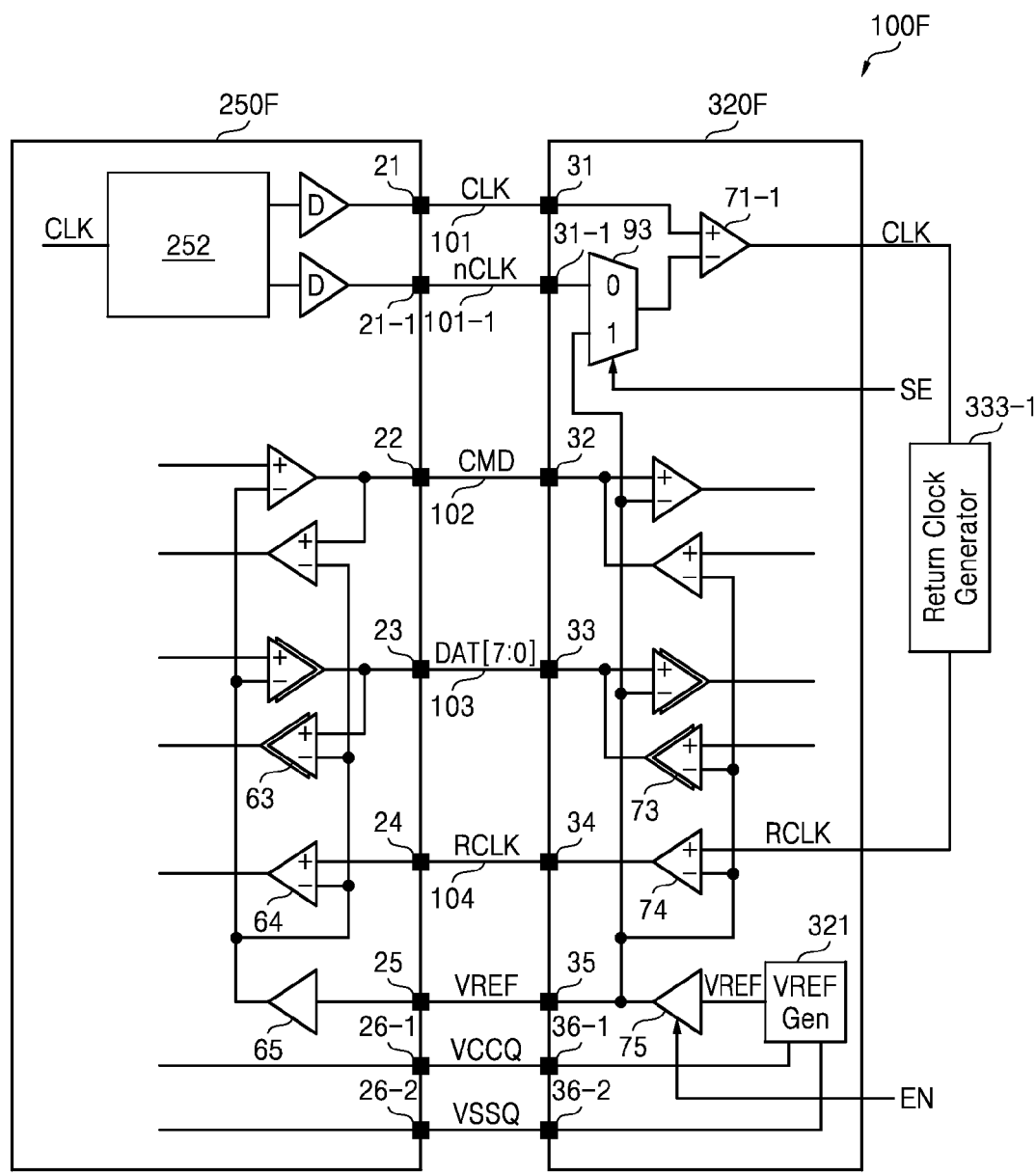
FIG. 14 is a diagram further illustrating the I/O blocks of the eMMC system of FIG. 13.

FIG. 13 is a block diagram of an eMMC system 100F according to still another embodiment of the inventive concept. FIG. 14 is a diagram further illustrating the I/O blocks 250F and 320F of the eMMC system 100F of FIG. 13. Referring to FIG. 13, the eMMC system 100F includes a host 200F and a device (eMMC) 300F.

The structure and operation of the eMMC system 100F illustrated in FIG. 13 are substantially the same as those described in relation to the eMMC system 100A of FIG. 1, except for the structure and operation of the host I/O block 250F in a host controller 230F and the structure and operation of the eMMC I/O block 320F in an eMMC controller 310F.

The eMMC 300F includes the reference voltage generator 321 generating the reference voltage VREF. Apart from the return clock line 104, the complementary clock line 101-1 and the reference voltage line 105 are additionally provided between the host I/O block 250F and the eMMC I/O block 320F.

A selection circuit 93 included in the eMMC I/O block 320F outputs one of the complementary clock nCLK and the reference voltage VREF to the differential amplifier 71-1 in response to a selection signal SE output from the eMMC host interface 330. The differential amplifier 71-1 amplifies a difference between the clock CLK and the signal nCLK or VREF output from the selection circuit 93 and outputs the amplified clock CLK.

Since the differential amplifier 71-1 amplifies the difference between the differential clocks CLK and nCLK when the complementary clock nCLK is input to the differential amplifier 71-1, it has a robust noise margin, and the differential amplifier 71-1 may operate a very fast relative speed.

However, when the reference voltage VREF is input to the differential amplifier 71-1, the differential amplifier 71-1 amplifies the difference between the clock CLK and the reference voltage VREF. Although the noise margin of the differential amplifier 71-1 using the clock CLK and the reference voltage VREF is less than that of the differential amplifier 71-1 using the differential clocks CLK and nCLK, the timing or duty ration of the clock CLK can be adjusted when the reference voltage VREF can be adjusted.

The return clock generator 333-1 generates the return clock RCLK based on the clock CLK output from the differential amplifier 71-1.

Figure 15:
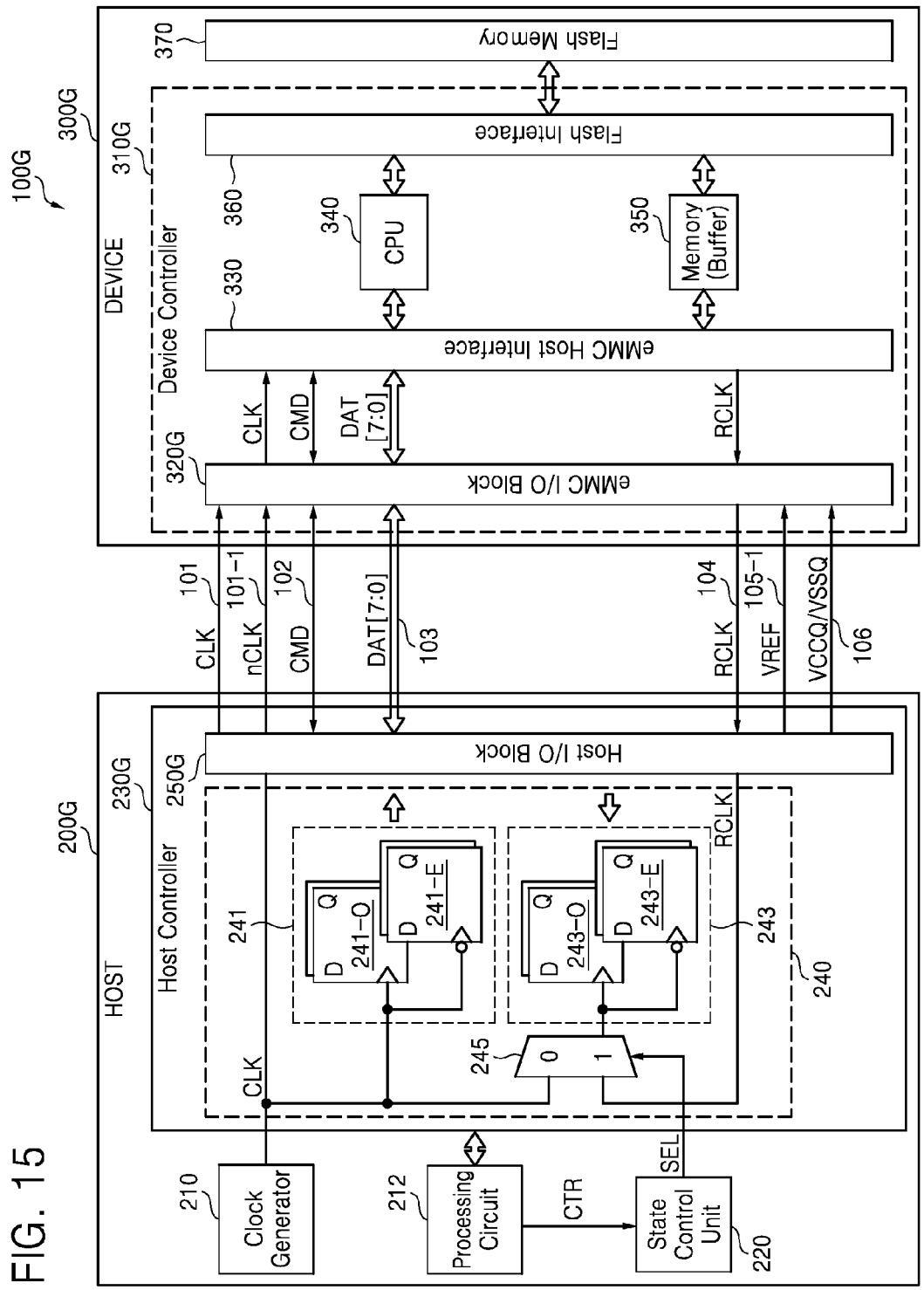
Figure 16:
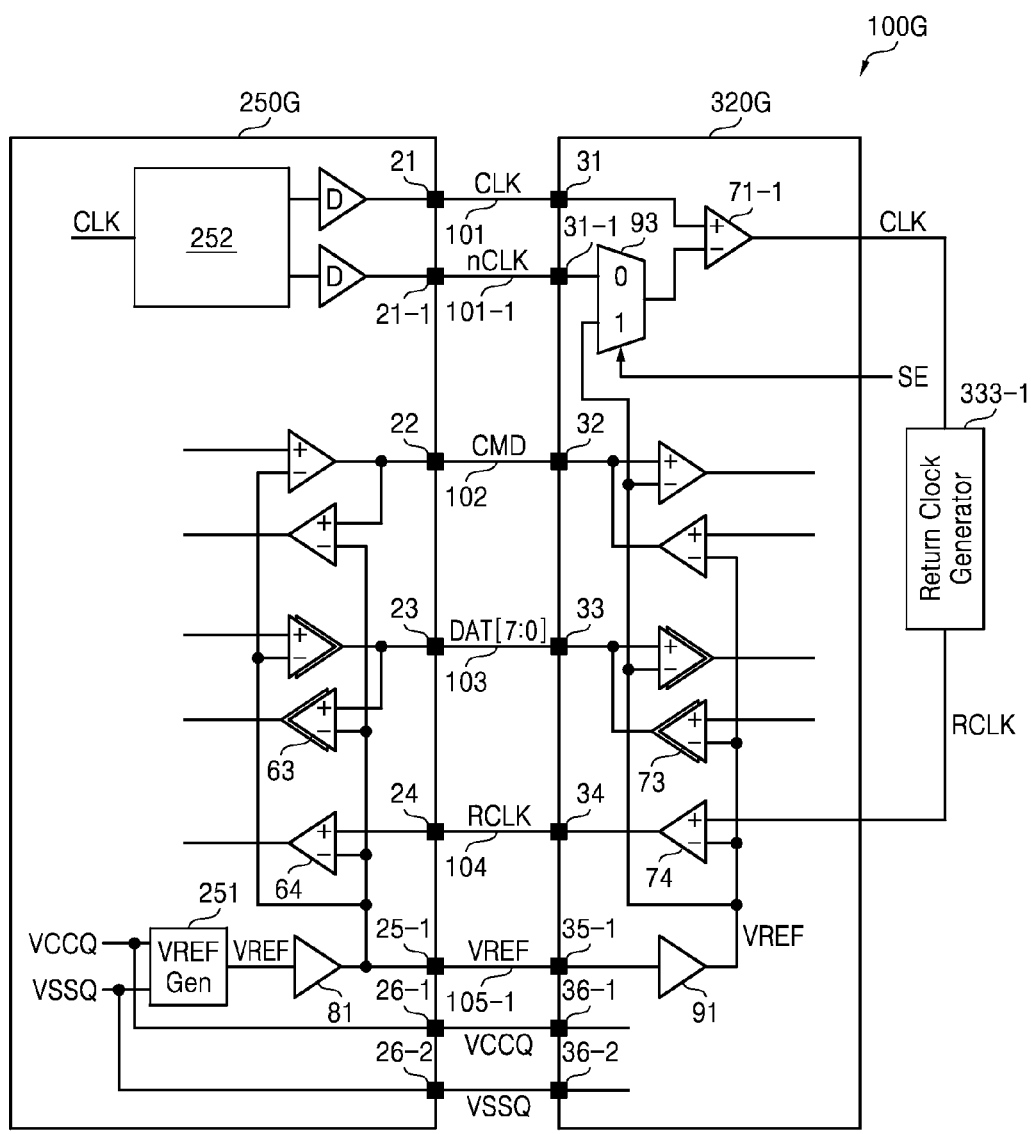
FIG. 16 is a diagram further illustrating the I/O blocks of the eMMC system of FIG. 15.

FIG. 15 is a block diagram of an eMMC system 100G according to still another embodiment of the inventive concept. FIG. 16 is a diagram further illustrating the I/O blocks 250G and 320G of the eMMC system 100G of FIG. 15. Referring to FIG. 15, the eMMC system 100G includes a host 200G and a device (eMMC) 300G.

The structure and operation of the eMMC system 100G illustrated in FIG. 15 are substantially the same as those described in relation to the eMMC system 100A of FIG. 1, except for the structure and operation of the host I/O block 250G in a host controller 230G and the structure and operation of the eMMC I/O block 320G in an eMMC controller 310G. The host 200G includes the reference voltage generator 251 that generates the reference voltage VREF. Apart from the return clock line 104, the complementary clock line 101-1 and the reference voltage line 105-1 are additionally provided between the host I/O block 250G and the eMMC I/O block 320G.

The selection circuit 93 included in the eMMC I/O block 320G outputs one of the complementary clock nCLK and the reference voltage VREF to the differential amplifier 71-1 in response to the selection signal SE output from the eMMC host interface 330. The differential amplifier 71-1 amplifies a difference between the clock CLK and the signal nCLK or VREF output from the selection circuit 93 and outputs the amplified clock CLK.

Figure 17:
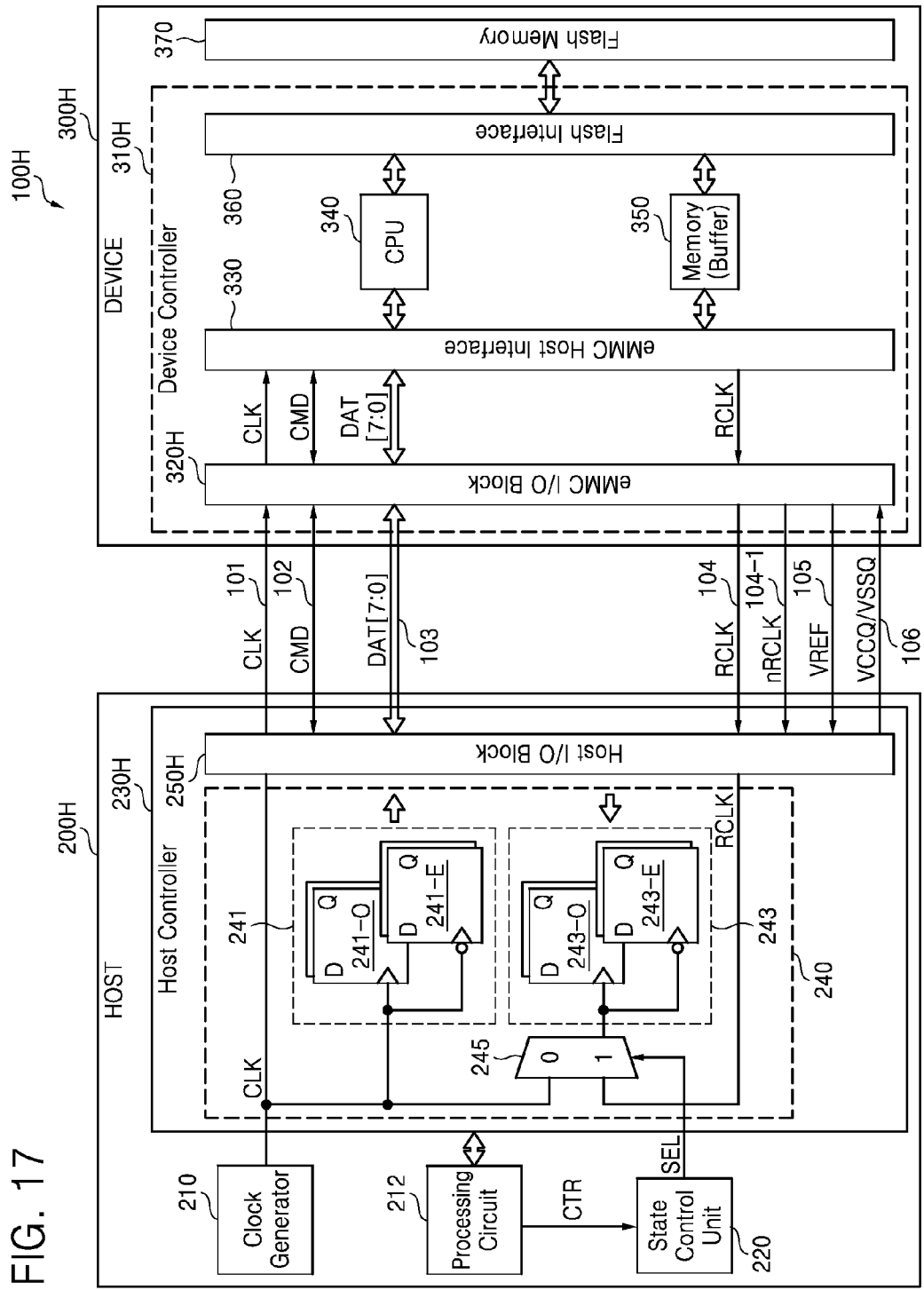
Figure 18:
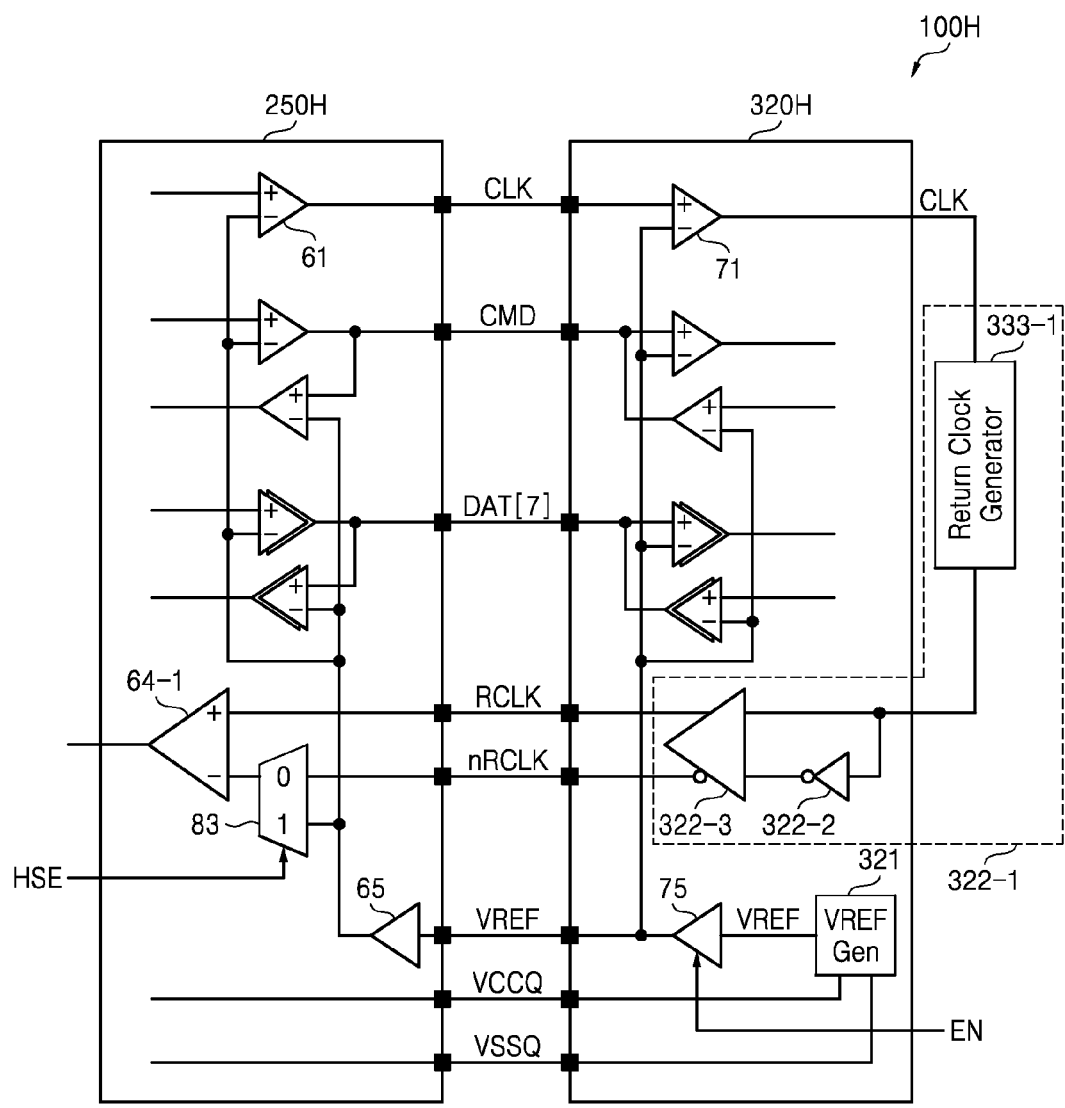
FIG. 18 is a diagram further illustrating the I/O blocks of the eMMC system of FIG. 17.

FIG. 17 is a block diagram of an eMMC system 100H according to still another embodiment of the inventive concept. FIG. 18 is a diagram further illustrating the I/O blocks 250H and 320H of the eMMC system 100H of FIG. 17. Referring to FIG. 17, the eMMC system 100H includes a host 200H and a device (eMMC) 300H.

The structure and operation of the eMMC system 100H illustrated in FIG. 17 are substantially the same as those described in relation to the eMMC system 100A of FIG. 1, except for the structure and operation of the host I/O block 250H in a host controller 230H, and the structure and operation of the eMMC I/O block 320H in an eMMC controller 310H. The eMMC 300H includes the reference voltage generator 321 that generates the reference voltage VREF. Apart from the return clock line 104, the complementary return clock line 104-1 and the reference voltage line 105 are additionally provided between the host I/O block 250H and the eMMC I/O block 320H.

A selection circuit 83 included in the host I/O block 250H outputs one of the complementary return clock nRCLK and the reference voltage VREF output from the receiver 65 to the differential amplifier 64-1 in response to a selection signal HSE output from the processing circuit 212. The differential amplifier 64-1 amplifies a difference between the return clock RCLK and the signal nRCLK or VREF output from the selection circuit 83 and outputs the amplified return clock RCLK to the selection circuit 245 or the read latch circuit 243. The differential return clock generator 322-1 generates the return clock RCLK and the complementary return clock nRCLK based on the clock CLK output from the differential amplifier 71.

Figure 19:
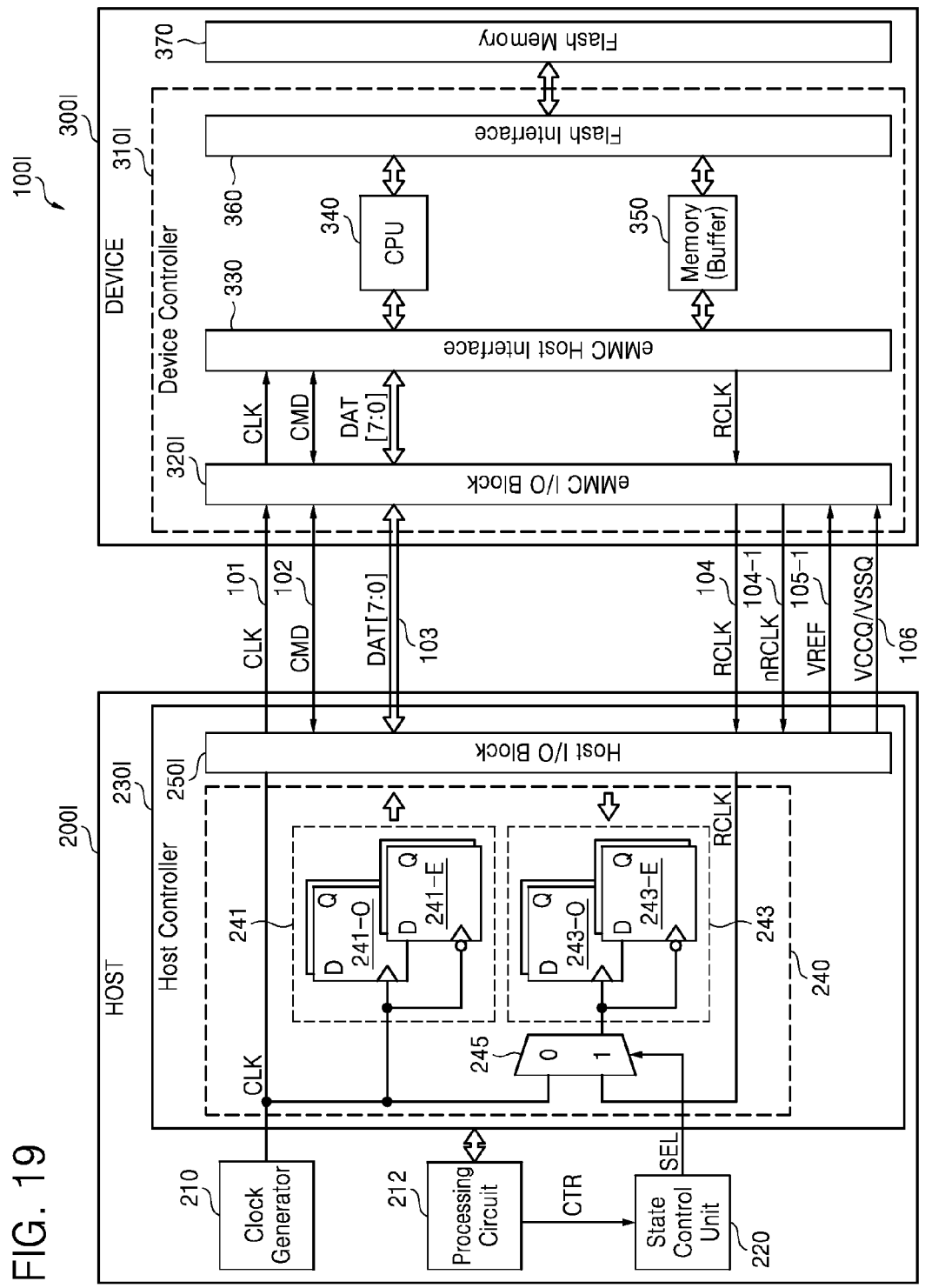
Figure 20:
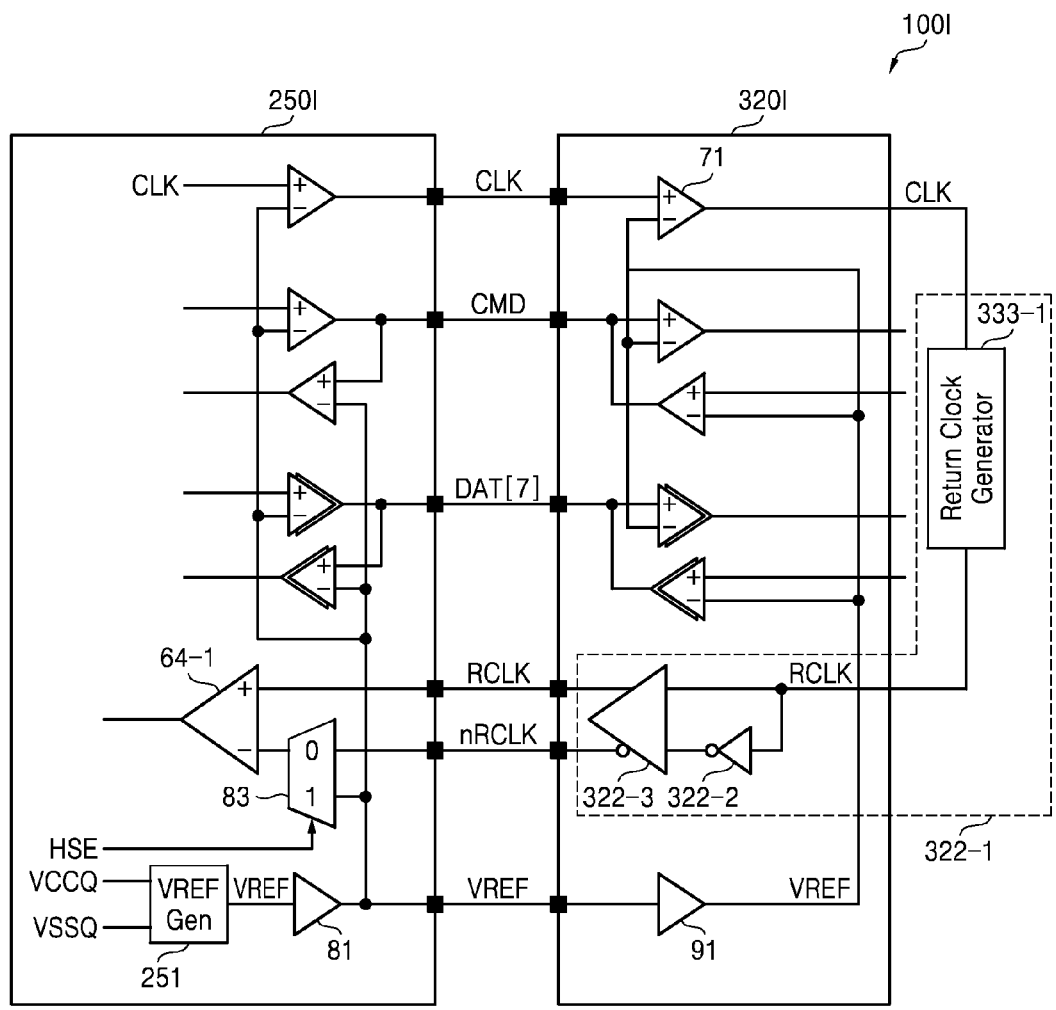
FIG. 20 is a diagram further illustrating the I/O blocks of the eMMC system of FIG. 19.

FIG. 19 is a block diagram of an eMMC system 100I according to still another embodiment of the inventive concept. FIG. 20 is a diagram further illustrating the I/O blocks 250I and 320I of the eMMC system 100I of FIG. 19. Referring to FIG. 19, the eMMC system 100I includes a host 200I and a device (eMMC) 300I.

The structure and operation of the eMMC system 100H illustrated in FIG. 17 are substantially the same as those described in relation to the eMMC system 100A of FIG. 1, except for the structure and operation of the of the host I/O block 250I in a host controller 230I and the structure and operation of the eMMC I/O block 320I in an eMMC controller 310I. The host 200I includes the reference voltage generator 251 that generates the reference voltage VREF. Apart from the return clock line 104, the complementary return clock line 104-1 and the reference voltage line 105-1 are additionally provided between the host I/O block 250I and the eMMC I/O block 320I.

The selection circuit 83 included in the host I/O block 250I outputs one of the complementary return clock nRCLK and the reference voltage VREF output from the driver 81 to the differential amplifier 64-1 in response to the selection signal HSE output from the processing circuit 212. The differential amplifier 64-1 amplifies a difference between the return clock RCLK and the signal nRCLK or VREF output from the selection circuit 83 and outputs the amplified return clock RCLK to the selection circuit 245 or the read latch circuit 243.

Figure 21:
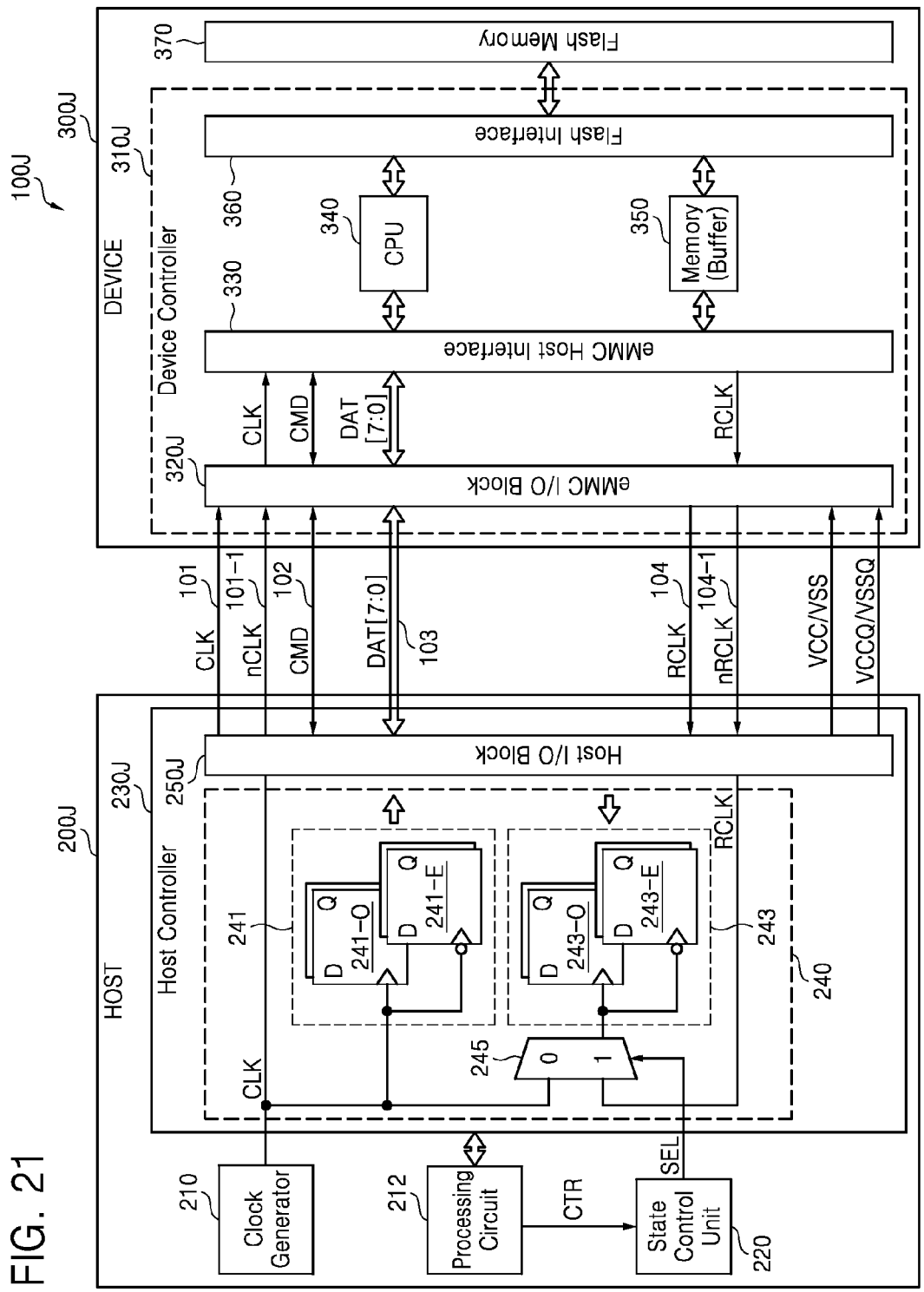
Figure 22:
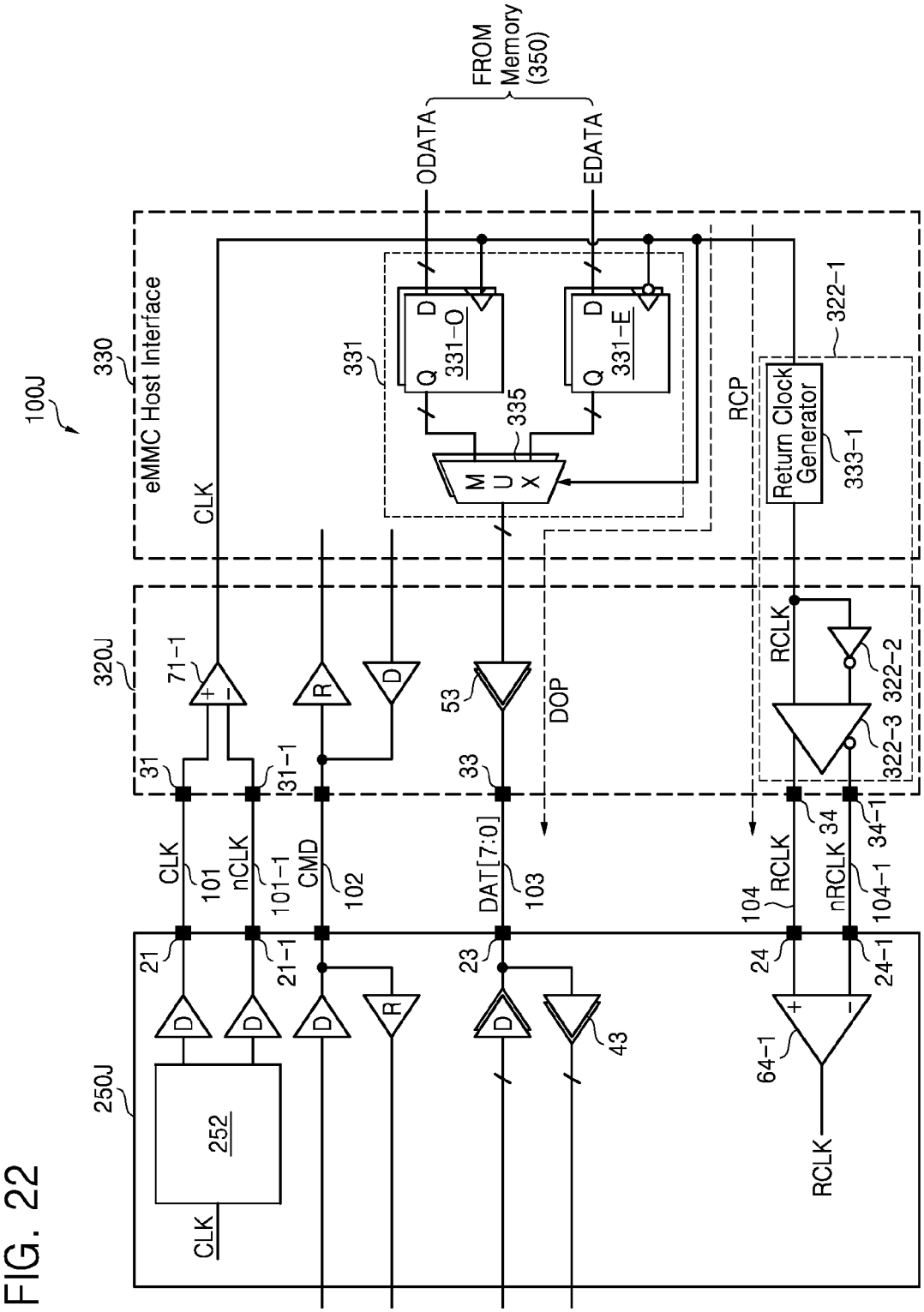
FIG. 22 is a diagram further illustrating the I/O blocks of the eMMC system of FIG. 21.

FIG. 21 is a block diagram of an eMMC system 100J according to still another embodiment of the inventive concept. FIG. 22 is a diagram further illustrating the I/O blocks 250J and 320J of the eMMC system 100J of FIG. 21. Referring to FIG. 21, the eMMC system 100J includes a host 200J and a device (eMMC) 300J.

The structure and operation of the eMMC system 100H illustrated in FIG. 17 are substantially the same as those described in relation to the eMMC system 100A of FIG. 1, except for the structure and operation of the host I/O block 250J in a host controller 230J, and the structure and operation of the eMMC I/O block 320J in an eMMC controller 310J. Apart from the return clock line 104, the complementary clock line 101-1 and the complementary return clock bus 104-1 are additionally provided between the host I/O block 250J and the eMMC I/O block 320J.

FIG. 23 is a table listing one possible set of signals that an eMMC interface according to certain embodiments of the inventive concept may use. FIG. 23 tabulates these exemplary signals—consistent with the foregoing embodiments illustrated in FIGS. 1 through 22 inclusive—by name, type, and description. Here, "nCLK" and "CLK_n" denote the same signal; "nRCLK" and "RCLK_n" denote the same signal; and "Reset" and "RST_n" denote the same signal.

FIG. 24 is a table listing possible inclusion to a device type field according to certain embodiments of the inventive concept. Referring to FIG. 24, a DEVICE_TYPE[196] field of the EXT_CSD register defines a type of the eMMC 300A. While only bits 0 through 5 of the DEVICE_TYPE[196] field are defined in the JESD84-B451, information indicating whether the eMMC 300A supports the DDR400 mode is stored in the DEVICE_TYPE[196] field according to the current embodiments.

For instance, information about whether a 200 MHz DDR mode is supported at a voltage of 1.8 V (i.e., VCCQ=1.8 V) is stored in bit 6 and information about whether a 200 MHz DDR mode is supported at a voltage of 1.2 V (i.e., VCCQ=1.2 V) is stored in bit 7.

The DEVICE_TYPE[196] field of the EXT_CSD register is transmitted from the eMMCs 300A through 300J (collectively denoted by 300) to the hosts 200A through 200J (collectively denoted by 200) according to the SEND_EXT_CSD command (=CMD8) output from the hosts 200. Accordingly, the host 200 can determine whether the eMMC 300 supports the DDR400 mode based on bit 6 or 7 stored in the DEVICE_TYPE[196] field of the EXT_CSD register.

FIG. 25, inclusive of FIGS. 25A and 25B, illustrates HS_TIMING and HS_TIMING values according to certain embodiments of the inventive concept. Referring to FIG. 25, an HS_TIMING[185] field of the EXT_CSD register is used by the host 200 to select a timing interface and a driver strength. In the current embodiments of the inventive concept, "0x3" is added to the HS_TIMING[185] field.

When the host 200 sets the HS_TIMING[185] field to "1", the eMMC 300 changes to high speed interface timing. When the host 200 sets the HS_TIMING[185] field to "2", the eMMC 300 changes to HS200 interface timing.

When the host 200 sets the HS_TIMING[185] field to "3", the eMMC 300 changes to DDR400 interface timing. Embodiments implementing DDR400 interface timing in relation to the DDR400 mode of operation are illustrated in FIGS. 26, 27, 28 and 29 as examples. In other words, the host 200 issues a SWITCH command (CMD6) to set a DDR400 bit and a driver strength value in the HS_TIMING[185] field of the EXT_CSD register.

Figure 26:
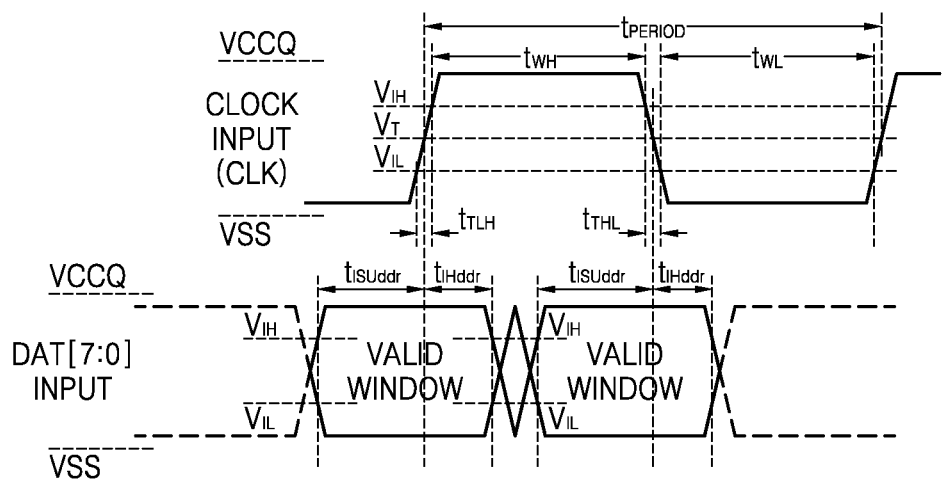
FIG. 26 is a timing chart illustrating the operation of a dual data rate (DDR) device that may be incorporated in certain embodiments of the inventive concept.

Thus, FIG. 26 is a timing chart of DDR400 device inputs according to certain embodiments of the inventive concept. FIG. 27 is a table listing parameters used in the timing chart of FIG. 26.

FIG. 28 is a timing chart of DDR400 device outputs according to certain embodiments of the inventive concept. FIG. 29 is a table listing parameters used in the timing chart of FIG. 28.

Figure 30:
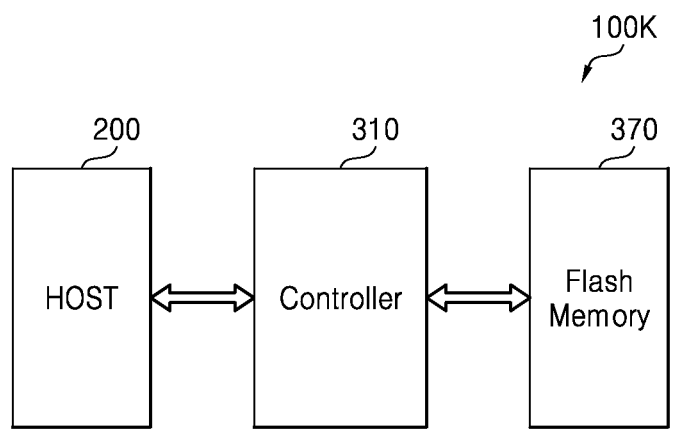
FIG. 30 is a general block diagram of a data processing system that may incorporate an embodiment of the inventive concept.

FIG. 30 is a general block diagram of a data processing system 100K that may incorporate an eMMC system according to an embodiment of the inventive concept. Referring to FIG. 30, the data processing system 100K includes a host 200 and a "device" formed by the combination of a controller 310 (e.g., 310A through 310J) and the flash memory 370. In the data processing system 100K, it is assumed that the device controller 310 is separated from the flash memory 370, but this need not always be the case.

Figure 31:
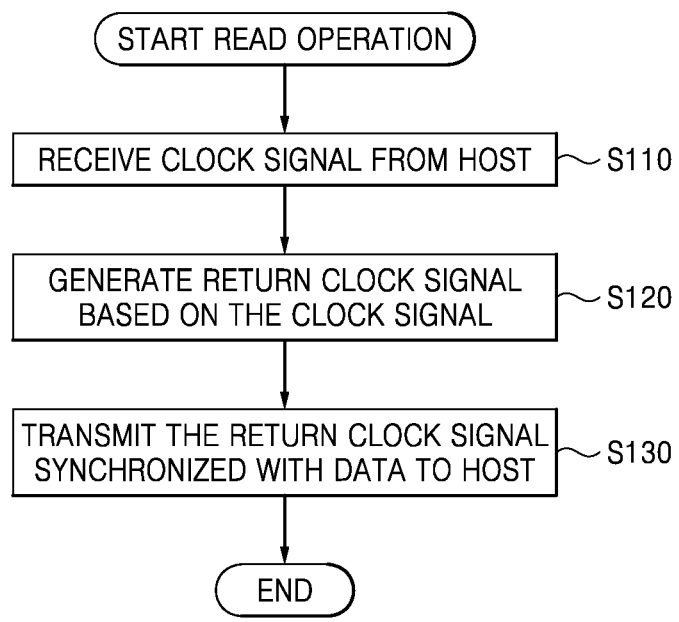
FIG. 31 is a flowchart summarizing a method of generating a return clock according to certain embodiments of the inventive concept.

FIG. 31 is a flowchart summarizing a method of generating the return clock RCLK according to certain embodiments of the inventive concept. Referring collectively to FIGS. 1 through 31, during a DDR read operation, the device controller 310 of a corresponding eMMC system 100A through 100K receives the clock CLK from the host 200 (S110).

Then, the device controller 310 generates the return clock RCLK based on the clock CLK (S120). The device controller 310 transmits the return clock RCLK synchronously with the parallel data DAT[7:0] to the host 200 through the return clock bus 104 (S130). The host 200 latches the data DAT[7:0] transmitted from the device controller 310 using the return clock RCLK.

As described above, during a data write operation performed according to the DDR400 mode of operation, or during other modes of operation, each of the signals RCLK, nRCLK, nCLK, and VREF may be maintained at a particular level (e.g., the I/O operating voltage VCCQ or the ground voltage VSSQ). Hence, the functional block(s) generating each of the signals RCLK, nRCLK, nCLK, and VREF may be disabled under the control of the processing circuit 212 or the eMMC host interface 330. At least one of the signals RCLK, nRCLK, nCLK, and VREF defined according to embodiments of the inventive concept may be used during a data processing operation according to the device types described with reference to FIG. 24, for example.

Various eMMCs having one or more new (or additional) structural connections with a corresponding host have been described in according to embodiments of the inventive concept. These additional structural connections, together with related operating principles, may be used to increase a data rate by decreasing or eliminating a timing skew between a clock and data thereby securing a maximum sized a data valid window. Certain eMMCs according to the inventive concept use differential signaling to thereby eliminate interference between signal lines and/or noise occurring because of the transmission of a clock signal. Furthermore, certain eMMCs according to the inventive concept use a reference voltage to distinguish a low level from a high level with respect to a signal input applied to a pad to thereby eliminate or reduce the influence of power noise.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. An embedded multimedia card (eMMC) comprising:
   a clock channel that receives a clock from a host via a clock line;
   a command channel that receives a command from the host via a command line;
   a plurality of data channels that transmit data to the host via data lines in accordance with the received command;
   a return clock generator that generates a return clock based on the received clock;
   a return clock channel that transmits the return clock to the host synchronously with the data via a return clock line separate from the clock line, the command line, and the data lines; and
   a reference voltage generator that generates a reference voltage based on input/output operating voltages received from the host, a difference between the input/output operating voltages defining half the swing range of the received clock.

2. The eMMC of claim 1, wherein the return clock generator generates the return clock by delaying the clock by a delay period.

3. The eMMC of claim 1, further comprising:
   a flash memory that stores the data;
   a data transmission circuit that transmits the data stored in the flash memory via the plurality of data channels synchronously with the clock,
   wherein a first latency for a first output path including the data transmission circuit is the same as a second latency for a second output path including the return clock generator.

4. The eMMC of claim 1, further comprising:
a reference voltage channel that transmits the reference voltage to the host via a reference voltage line separate from the clock line, the command line, the data lines, and the return clock line.

5. The eMMC of claim 1, further comprising:
a reference voltage channel that receives a reference voltage provide by the host via a reference voltage line separate from the clock line, the command line, the data lines, and the return clock line, wherein
the reference voltage provided by the host corresponds to half of the operating voltage of the clock channel or half of the swing range of the clock.

6. The eMMC of claim 1, further comprising:
a complementary clock channel that receives a complementary clock from the host via a complementary clock line separate from the clock line, the command line, the data lines, and the return clock line.

7. The eMMC of claim 6, further comprising:
a differential amplifier that receives the clock and the complementary clock and provides a corresponding output signal, wherein
the return clock generator generates the return clock based on the output signal of the differential amplifier.

8. The eMMC of claim 1, further comprising:
a complementary return clock channel that transmits a complementary return clock to the host via a complementary return clock line separate from the clock line, the command line, the data lines, and the return clock line.

9. The eMMC of claim 8, further comprising:
a differential return clock generator that generates the return clock and the complementary return clock based on the clock.

10. The eMMC of claim 1, further comprising:
a complementary clock channel that receives a complementary clock from the host via a complementary clock line separate from the clock line, the command line, the data lines, and the return clock line; and
a reference voltage channel that transmits the reference voltage to the host via a reference voltage line separate from the clock line, the complementary clock line, the command line, the data lines, and the return clock line.

11. The eMMC of claim 1, further comprising:
a complementary clock channel that receives a complementary clock from the host via a complementary clock line separate from the clock line, the command line, the data lines, and the return clock line; and
a reference voltage channel that receives a reference voltage from the host, via a reference voltage line separate from the complementary clock line, the clock line, the command line, the data lines, and the return clock line, wherein
the reference voltage received from the host corresponds to half of the operating voltage of the clock channel or half of the swing range of the clock.

12. The eMMC of claim 1, further comprising:
a reference voltage channel that transmits to the host the reference voltage via a reference voltage line separate from the clock line, the command line, the data lines, and the return clock line; and
a complementary return clock channel that transmits a complementary return clock to the host via a complementary clock line separate from the clock line, the reference voltage line, the command line, the data lines, and the return clock line.

13. The eMMC of claim 12, further comprising:
a differential amplifier that receives the reference voltage and the clock; and
a differential return clock generator that generates the return clock and a complementary return clock based on an output signal of the differential amplifier.

14. The eMMC of claim 1, further comprising:
a complementary clock channel that receives a complementary clock from the host via a complementary clock line separate from the clock line, the command line, the data lines, and the return clock line; and
a complementary return clock channel that transmits a complementary return clock to the host via a complementary return clock line separate from the clock line, the complementary clock line, the command line, the data lines, and the return clock line.

15. An embedded multimedia card (eMMC) comprising:
a clock channel that receives a clock from a host via a clock line;
a command channel that receives a command from the host via a command line;
a plurality of data channels that transmit data to the host via data lines;
a return clock channel that transmits a return clock to the host synchronously with the data via a return clock line separate from the clock line, the command line, and the data lines;
a flash memory that stores the data;
a data transmission circuit that transmits the data stored in the flash memory via the plurality of data channels synchronously with the clock; and
a return clock generator that generates the return clock based on the clock,
wherein a first latency for a first output path including the data transmission circuit is the same as a second latency for a second output path including the return clock generator.

* * * * *